(12) United States Patent
Nishihara et al.

(10) Patent No.: US 10,771,719 B2
(45) Date of Patent: Sep. 8, 2020

(54) IMAGING ELEMENT

(71) Applicant: SONY SEMICONDUCTOR SOLUTIONS CORPORATION, Kanagawa (JP)

(72) Inventors: Toshiyuki Nishihara, Kanagawa (JP); Tomohiro Takahashi, Tokyo (JP); Masao Matsumura, Kanagawa (JP); Tsutomu Imoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/318,650

(22) PCT Filed: Jul. 14, 2017

(86) PCT No.: PCT/JP2017/025656
§ 371 (c)(1),
(2) Date: Jan. 17, 2019

(87) PCT Pub. No.: WO2018/021053
PCT Pub. Date: Feb. 1, 2018

(65) Prior Publication Data
US 2019/0222783 A1    Jul. 18, 2019

(30) Foreign Application Priority Data

Jul. 28, 2016  (JP) ................. 2016-147994

(51) Int. Cl.
*H04N 5/357*  (2011.01)
*H04N 5/378*  (2011.01)
(Continued)

(52) U.S. Cl.
CPC ......... *H04N 5/3575* (2013.01); *H01L 27/146* (2013.01); *H01L 27/14634* (2013.01);
(Continued)

(58) Field of Classification Search
CPC ...... H04N 5/3575; H04N 5/357; H04N 5/369; H04N 5/374; H04N 5/37452;
(Continued)

(56) References Cited

U.S. PATENT DOCUMENTS

2004/0130757 A1    7/2004  Mabuchi
2007/0222483 A1*   9/2007  Lee ..................... G11C 27/026
                                              327/94

(Continued)

FOREIGN PATENT DOCUMENTS

| JP | 2004-140149 | 5/2004 |
| JP | 2007-074435 | 3/2007 |
| JP | 2012-248952 | 12/2012 |

OTHER PUBLICATIONS

International Search Report prepared by the Japan Patent Office dated Sep. 20, 2017, for International Application No. PCT/JP2017/025656.

*Primary Examiner* — Mekonnen D Dagnew
(74) *Attorney, Agent, or Firm* — Sheridan Ross P.C.

(57) ABSTRACT

The present technology relates to an imaging element that can reduce noise. The imaging element includes: a photoelectric conversion element; a first amplification element that amplifies a signal from the photoelectric conversion element; a second amplification element that amplifies an output from the first amplification element; an offset element provided between the first amplification element and the second amplification element; a first reset element that resets the first amplification element; and a second reset element that resets the second amplification element. The offset element is a capacitor. A charge is accumulated in the offset element via a feedback loop of an output from the second amplification element, and an offset bias is generated. The present technology can be applied to an imaging element.

12 Claims, 16 Drawing Sheets

(51) Int. Cl.
  *H04N 5/369* (2011.01)
  *H01L 27/146* (2006.01)
  *H04N 5/374* (2011.01)
  *H04N 5/3745* (2011.01)

(52) U.S. Cl.
  CPC ............ *H04N 5/357* (2013.01); *H04N 5/369* (2013.01); *H04N 5/374* (2013.01); *H04N 5/378* (2013.01); *H04N 5/379* (2018.08); *H04N 5/3745* (2013.01); *H04N 5/37452* (2013.01)

(58) Field of Classification Search
  CPC ...... H04N 5/3745; H04N 5/379; H04N 5/378; H01L 27/146; H01L 27/14634
  See application file for complete search history.

(56) References Cited

U.S. PATENT DOCUMENTS

2014/0139713 A1* 5/2014 Gomi ................ H01L 27/14618
  348/308
2016/0134824 A1 5/2016 Gomi

* cited by examiner

IMAGING ELEMENT

CROSS REFERENCE TO RELATED APPLICATIONS

This application is a national stage application under 35 U.S.C. 371 and claims the benefit of PCT Application No. PCT/JP2017/025656 having an international filing date of 14 Jul. 2017, which designated the United States, which PCT application claimed the benefit of Japanese Patent Application No. 2016-147994 filed 28 Jul. 2016, the entire disclosures of each of which are incorporated herein by reference.

TECHNICAL FIELD

The present technology relates to an imaging element, for example, an imaging element suitable for suppressing variations in the output of pixels and performing the high speed global shutter.

BACKGROUND ART

In recent years, there has been an increasing demand for global shutters using CMOS image sensors for imaging for industrial production lines and for imaging subjects moving at high speed.

In a CMOS image sensor, a plurality of pixels share one reading circuit, and sequential reading is performed for each pixel. At that time, a so-called rolling shutter is adopted. The rolling shutter is a system in which exposure accumulation synchronized with reading is performed for each pixel. Therefore, different exposure times are obtained for each pixel included in one frame.

In such a rolling shutter, it is known that so-called focal plane distortion occurs in a subject moving at high speed. Moreover, in a case where pulsed light is detected by the CMOS image sensor, one pulse emission is divided into two frames and output with the pixel being read at that time as the boundary, and detection is difficult.

Thus, the adoption of global shutters which align exposure times with all effective pixels is increasing. Mainly, in such global shutters, exposing is started simultaneously with electronic shutters, and after the exposure is completed simultaneously, accumulated charges are temporarily stored in floating diffusion, which is an input of a pixel amplifier, until reading for each pixel is performed.

As compared with a rolling shutter that can continuously read a reset signal and an accumulated signal and perform correlated double sampling (CDS) between the signals, the global shutter is hard to control an output offset for each pixel after the reset.

There is a fixed offset component due to the characteristic variation of elements in the output of each pixel, and furthermore, if the floating diffusion is reset, random kTC noise is generated for each pixel.

In the rolling shutter, at the time of reading of the accumulated signal, after the reset of the floating diffusion of the pixel is performed, auto zero is applied to a comparator and an amplifier of the subsequent stage, so that the offset can be easily canceled for each pixel. Therefore, if the accumulated signal is continuously read and subjected to AD conversion thereafter, the output offset due to the kTC noise of the pixel or the characteristic variation has already been removed.

On the other hand, in the global shutter, it is impossible to continuously read the reset level and the accumulation level in the same pixel, and therefore, it is impossible to perform such offset cancellation for each pixel.

As one of countermeasures, for example, Patent Document 1 proposes a method of resetting a pixel again after reading an accumulated signal and canceling a fixed offset by taking a difference from a reset signal.

Furthermore, as a method for performing cancellation including the kTC noise for each pixel, Patent Document 2 proposes reading twice before and after the start of exposure. In this proposal, reset is first performed before the start of exposure, and a reset signal for each pixel is acquired for all effective pixels and is stored in a memory or the like as digital data. Those are subtracted from the accumulated signals acquired after completion of exposure, and the CDS is performed.

CITATION LIST

Patent Documents

Patent Document 1: Japanese Patent Application Laid-Open No. 2007-074435
Patent Document 2: Japanese Patent Application Laid-Open No. 2004-140149

SUMMARY OF THE INVENTION

Problems to be Solved by the Invention

According to Patent Document 1, the kTC noise which is a random component is generated independently by different reset operations, and therefore, there is a possibility that the kTC noise is multiplexed and increased.

According to Patent Document 2, reading of a reset signal before exposure is processing of AD converting an uncanceled offset component amount for each pixel and digitally storing the result. On the other hand, in the rolling shutter, this process can be omitted by auto zero operation. Alternatively, even in a case where higher accuracy is required, it is only necessary to cancel a weak offset occurring from a circuit on a reading side.

However, since the time required for the AD conversion is determined by the magnitude of the signal range to be converted and the conversion accuracy, there is a possibility that the conversion of the reset signal in the global shutter becomes a large temporal loss as compared with the rolling shutter.

Furthermore, it is also desired to reduce the kTC noise and to eliminate the output offset caused by the variation in the element characteristics. Furthermore, a mechanism that can be applied to the global shutter is desired.

The present technology has been made in view of such a situation, and is intended to reduce noise and to reduce offset caused by variations.

Solutions to Problems

An imaging element according to an aspect of the present technology includes: a photoelectric conversion element; a first amplification element that amplifies a signal from the photoelectric conversion element; a second amplification element that amplifies an output from the first amplification element; an offset element provided between the first amplification element and the second amplification element; a first reset element that resets the first amplification element; and a second reset element that resets the second amplification element.

An imaging element according to an aspect of the present technology includes: a photoelectric conversion element; a first amplification element that amplifies a signal from the photoelectric conversion element; a second amplification element that amplifies an output from the first amplification element; an offset element provided between the first amplification element and the second amplification element; a first reset element that resets the first amplification element; and a second reset element that resets the second amplification element.

Effects of the Invention

According to one aspect of the present technology, it is possible to reduce noise and reduce offset caused by variations.

Note that the effects described herein are not necessarily limited, and any of the effects described in the present disclosure may be applied.

MODES FOR CARRYING OUT THE INVENTION

Hereinafter, modes (hereinafter referred to as embodiments) for implementing the present technology will be described.

Configuration of Imaging Element in First Embodiment

Figure 1:
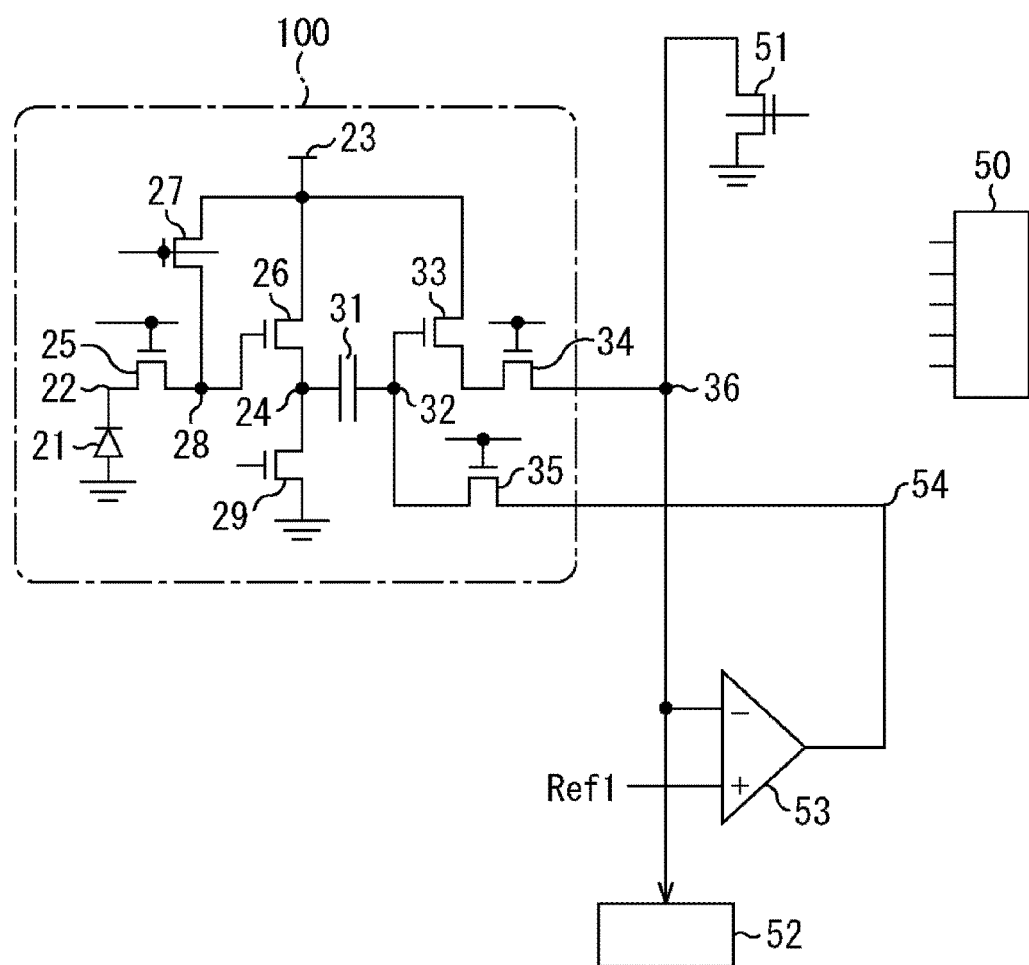
FIG. 1 is a diagram showing a configuration of an embodiment of an imaging element to which the present technology is applied.

FIG. 1 shows a configuration of a pixel of an image sensor according to a first embodiment to which the present technology is applied. A pixel 100 shown in FIG. 1 includes a photodiode 21, a cathode (accumulation node) 22, a power supply 23, an output node 24, a transfer transistor 25, a first amplification transistor 26, a first reset transistor 27, a first detection node 28, and a load transistor 29.

Furthermore, the pixel 100 includes a coupling capacitor 31, a second detection node (input node) 32, a second amplification transistor 33, a selection transistor 34, a second reset transistor 35, and an output signal line 36.

Furthermore, a row drive circuit 50, a load transistor 51, a detection circuit 52, a differential amplification circuit 53, and a feedback signal line 54 are connected to the pixel 100.

In the pixel 100 having such a configuration, a signal charge photoelectrically converted by the photodiode 21 and accumulated in the cathode 22 of the photodiode 21 is transferred via the transfer transistor 25 to the first detection node 28 including floating diffusion.

The output of the pixel 100 is a two-stage amplifier configuration (configuration for amplifying in two stages), for a signal of the first detection node 28, amplification of the first stage is performed by the first amplification transistor 26, and amplification of the second stage is performed by the second amplification transistor 33 in which the second detection node 32 is used as an input. The result amplified in the two stages is output to the output signal line 36.

The output node 24 that is the output of the amplifier of the first stage and the input node 32 that is the input of amplifier of the second stage are connected via the coupling capacitor 31.

Moreover, if the photodiode 21, the cathode 22, and the first detection node 28 are reset, the pixel output 36 is fed back in reverse phase via the differential amplification circuit 53 installed for each column, and an offset charge is generated in the coupling capacitor 31.

In other words, charges are accumulated in the coupling capacitor 31 via the feedback loop of the output from the second amplification transistor 33, and an offset bias is generated. As a result, the pixel output 36 (an output output to the output signal line 36) of the pixel 100 at the time of reset is adjusted to have the same potential as the reference input Ref1 of the differential amplification circuit 53.

The configuration and operation will be further described below.

The pixel 100 shown in FIG. 1 includes, as a detection unit of the first stage, the photodiode 21, the cathode 22 (accumulation node 22) of the photodiode 21, the output node 24 of the first stage, the transfer transistor 25, the first amplification transistor 26, the first reset transistor 27, the first detection node 28, and the load transistor 29.

The pixel 100 also includes, as a detection unit of the second stage, the coupling capacitor 31, the second detection node 32, the second amplification transistor 33, the selection transistor 34, and the second reset transistor 35. The result detected in the pixel 100 is output to the output signal line 36.

For example, an n-type metal-oxide semiconductor (MOS) transistor or a p-type transistor can be used as the transistor (for example, the selection transistor 34 or the like) in the pixel 100.

The photodiode 21 converts photons into electric charges. The photodiode 21 is connected to the transfer transistor 25 via the accumulation node 22 which is the cathode thereof. The photodiode 21 generates pairs of electrons and holes from photons incident on the silicon substrate, and accumulates electrons among them in the accumulation node 22. The photodiode 21 can be formed as an embedded type in which the accumulation node 22 is completely depleted at the time of discharging of charges by the reset.

The transfer transistor 25 transfers charges from the accumulation node 22 to the first detection node 28 under the control of the row drive circuit 50. Note that the row drive circuit 50 drives a plurality of pixels 100 in parallel, with a large number of driving output terminals. However, in the drawing, the notation of the connecting portion is omitted for simplicity.

The first detection node 28 accumulates charges from the transfer transistor 25 and generates an analog voltage corresponding to the amount of accumulated charges. This voltage is applied to the gate of the first amplification transistor 26.

The first reset transistor 27 extracts out the charges accumulated in the first detection node 28 or the accumulation node 22 to the power supply and initializes the charges. The gate of the first reset transistor 27 is connected to the row drive circuit 50, the drain is connected to the power supply 23, and the source is connected to the first detection node 28.

For example, the row drive circuit 50 controls the first reset transistor 27 and the transfer transistor 25 to be in an on state at the same time, to extract the electrons accumulated in the accumulation node 22 to the power supply 23 and initialize the pixels to the dark state before accumulation, that is, a state in which light is not incident. Furthermore, the row drive circuit 50 controls only the first reset transistor 27 to be in an on state, to extract the charges accumulated in the first detection node 28 to the power supply 23 and initialize the charge amount.

The first amplification transistor 26 drives the output node 24 of the first stage according to the gate voltage. The gate of the first amplification transistor 26 is connected to the first detection node 28, the drain is connected to the power supply, and the source is connected to the load transistor 29.

The first amplification transistor 26 and the load transistor 29 form a source follower amplifier, for example. The load transistor 29 functions as a constant current source by fixing the gate voltage and causing the gate voltage to saturation operate, and the voltage variation of the first detection node 28 is transmitted to the output node 24 of the first stage with a gain of less than 1 and is output.

Alternatively, the gate of the load transistor 29 may be connected to the row drive circuit 50 to make an output reset. In this case, the load transistor 29 is turned on and off, so that the output node 24 of the first stage is connected to the ground and then extracted by the first amplification transistor 26, and the output node 24 is fixed to a level obtained by subtracting the threshold of the first amplification transistor 26 from the potential of the first detection node 28. Moreover, the potential of the output node 24 of the first stage is transmitted to the second detection node 32 via the coupling capacitor 31.

The second amplification transistor 33 outputs a signal to the output signal line 36 according to the gate voltage. The gate of the second amplification transistor 33 is connected to the second detection node 32, the drain is connected to the power supply 23, and the source is connected to the load transistor 51 via the selection transistor 34.

The second amplification transistor 33 and the load transistor 51 form a source follower amplifier. The load transistor 51 functions as a constant current source by fixing the gate voltage and causing the gate voltage to saturation operate, and the voltage variation of the second detection node 32 is transmitted to the output signal line 36 with a gain of less than 1 and is output.

The selection transistor 34 outputs an electric signal under the control of the row drive circuit 50. The gate of the selection transistor 34 is connected to the row drive circuit 50, the drain is connected to the second amplification transistor 33, and the source is connected to the output signal line 36. Then, the output signal from the pixel 100 is detected by the detection circuit 52, and AD conversion is performed.

Moreover, the output signal line 36 is connected to an input on one side of the differential amplification circuit 53. A reference voltage Ref1 for controlling the level of the output signal line 36 is connected to the input of the side of the differential amplification circuit 53, the side not being connected with the output signal line 36.

At the time of reset of the pixel 100, the output from the differential amplification circuit 53 is negatively fed back and is supplied to the second detection node 32 via the second reset transistor 35. As a result, an offset charge is generated in the coupling capacitor 31, and the voltage level of the output signal line 36 is controlled to the same voltage as the reference input Ref1 of the differential amplification circuit 53.

When the first detection node 28 is reset by driving the first reset transistor 27, the offset occurring in the output node 24 of the first stage is mainly as follows.

Offset 1-1. kTC noise generated at the first detection node 28

Offset 1-2. Feedthrough generated when the first reset transistor 27 is turned off and its variation Offset 1-3. Threshold variation of the first amplification transistor 26

Offset 1-4. Random noise occurring in the channel of the first amplification transistor 26

By the way, pixels of many image sensors conventionally include only the first stage. In the present technology, by adding the configuration of the second stage in addition to the first stage, the total offset amount can be largely improved.

In other words, the offsets 1-1, 1-2, 1-3 are all canceled via the offset charge of the coupling capacitor 31 by driving of the second reset transistor 35 thereafter. Moreover, since the offset occurring in the output signal line 36 due to the threshold variation of the second amplification transistor 33 is also canceled, the remaining offset factors are as follows.

Offset 2-1. kTC noise generated at the second detection node 32

Offset 2-2. Feedthrough generated when the second reset transistor 35 is turned off and its variation Offset 2-3. Random noise occurring in the channels of the first amplification transistor 26 and the second amplification transistor 33

Since the charge signal photoelectrically converted by the photodiode 21 is directly transferred to the first detection node 28, in order to impart high sensitivity to the pixel 100, the parasitic capacitance of the first detection node 28 needs to be as small as possible. However, the offset 1-2 (feedthrough amount and its variation) is inversely proportional to the parasitic capacitance of the first detection node 28, and the offset 1-1 (kTC noise) is inversely proportional to its square root.

In other words, the reduction of the parasitic capacitance of the first detection node 28 directly leads to deterioration of the offset 1-1 and the offset 1-2. For this reason, a serious trade-off has occurred conventionally with respect to output variation and sensitivity. Accordingly, it is difficult to sufficiently cancel the offset only with the first detection node 28.

On the other hand, in the pixel 100 to which the present technology is applied, the parasitic capacitance of the second detection node 32 (the parasitic capacitance on the input side of the second amplification transistor 33) can be made sufficiently large, and the offset 2-1 and the offset 2-2 can be easily reduced. Furthermore, since it is possible to increase the parasitic capacitance of the second detection node 32 irrespective of the parasitic capacitance of the first detection node 28 (the parasitic capacitance on the input side of the first amplification transistor 26), deterioration of sensitivity of the pixel 100 can also be prevented.

The offset 2-3 may be deteriorated more than the conventional one by the amount of random noise of the second amplification transistor 33. However, by setting the gate area and the driving ability of the second amplification transistor 33 to be sufficiently large, the influence can be suppressed to an almost negligible level. In particular, since the 1/f noise and the burst noise are inversely proportional to the square root of the gate area, enlargement of the gate area is effective.

In view of these facts, the parasitic capacitance of the second detection node 32 (the input parasitic capacitance of the second amplification transistor 33) is made larger than the parasitic capacitance of the first detection node 28 (the input parasitic capacitance of the first amplification transistor 26). Furthermore, the gate area of the second amplification transistor is made larger than the gate area of the first amplification transistor.

Note that, even if the parasitic capacitance of the second detection node 32 is made to be about the same as or smaller than the parasitic capacitance of the first detection node 28, the offset can be cancelled more than in the case of the one-stage configuration by adopting a two-stage configuration as in the case of the present technology and offsetting the offset charge by the coupling capacitor 31. Furthermore, even if the gate area of the second amplification transistor is made to be about the same as or smaller than the gate area of the first amplification transistor, the offset can be cancelled more than in the case of the one-stage configuration by adopting a two-stage configuration as in the case of the present technology and offsetting the offset charge by the coupling capacitor 31.

<Configuration of Pixel Array>

Figure 2:
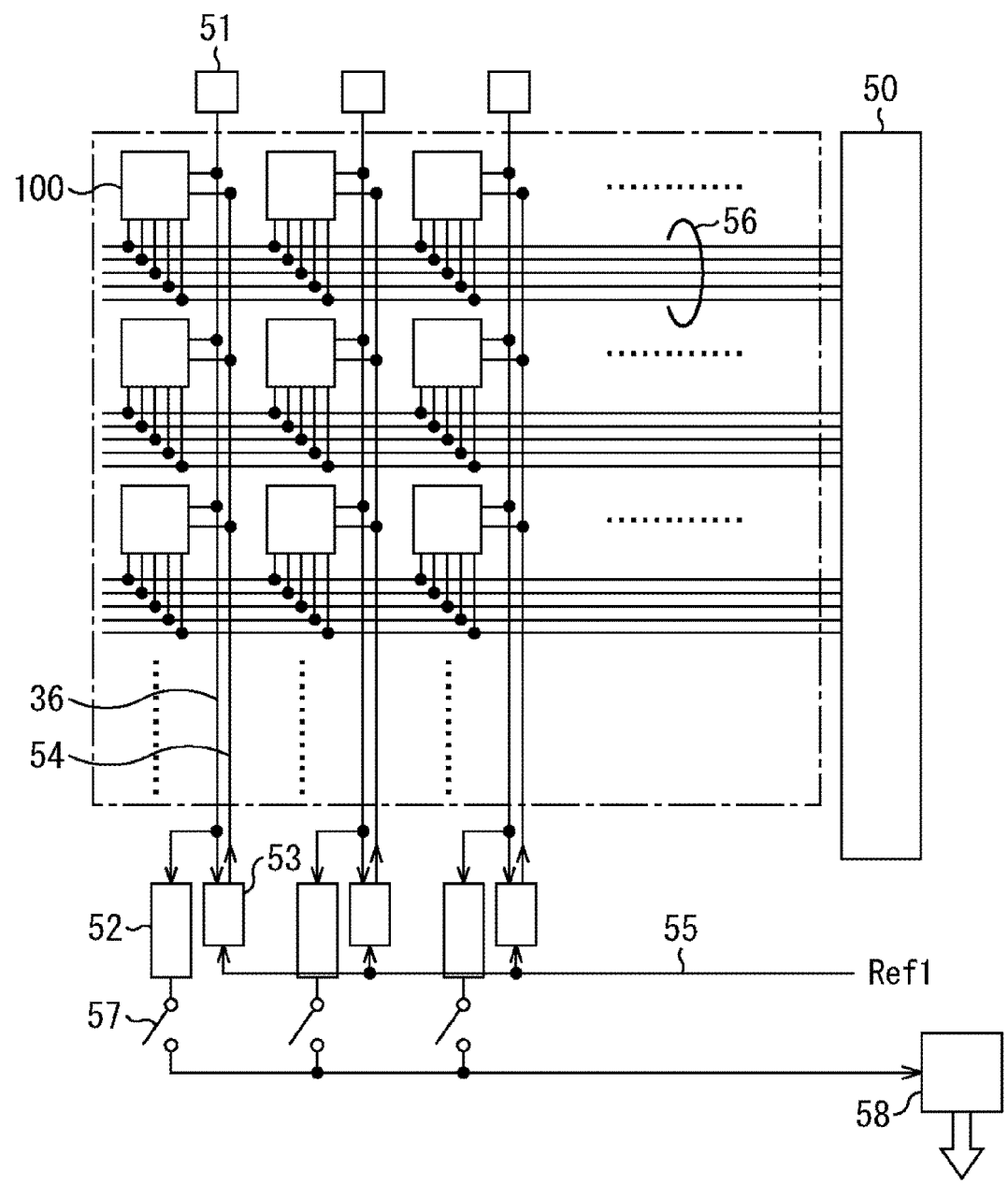
FIG. 2 is a diagram showing a configuration of a pixel array.

FIG. 2 shows a configuration example of a pixel array unit in which the pixels 100 shown in FIG. 1 are arrayed.

The detection circuit 52 is connected to a plurality of pixels 100 arranged in the column direction via the output signal line 36. Pixels to be read are alternatively selected by the selection transistor 34 in the pixels in FIG. 1.

Moreover, the differential amplification circuit 53 is connected via the plurality of pixels 100 arranged in the column direction, the output signal line 36, and the feedback signal line 54. One input of the differential amplification circuit 53 is connected to the output signal line 36, and the other input thereof is connected to the reference signal line 55, so that the reference signal Ref1 is imparted thereto.

A signal is output to the output signal line 36 at the time of reset and the pixel 100 that receives the feedback signal from the feedback signal line 54 is alternatively determined by the selection transistor 34 and the second reset transistor 35 in the pixel in FIG. 1.

Moreover, the row drive circuit 50 is shared by the plurality of pixels 100 arranged in the row direction via the drive signal lines 56. The drive signal lines 56 are connected to the gates of the transfer transistor 25, the first reset transistor 27, the load transistor 29, the selection transistor 34, and the second reset transistor 35 in the pixel 100, respectively, and simultaneously drive the gates of the plurality of pixels for each row.

Reading of a signal from the pixel 100 is performed in parallel with respect to the plurality of pixels for each row, and the signal is detected in parallel by a plurality of detection circuits 52 and subjected to AD conversion. Moreover, feedback of a signal at the time of reset is also performed in parallel with respect to a plurality of pixels for each row, and a feedback signal is supplied in parallel by a plurality of differential amplification circuits 53.

The output signals of a plurality of pixels detected simultaneously by the plurality of detection circuits 52 on a row basis and subjected to AD conversion are sequentially connected to an output circuit 58 by a switch 57, and serially output to the outside.

Next, the operation of the pixel 100 will be further described.

Here, described as an example is a case where a so-called global shutter is adopted in which the accumulation of the photoelectric conversion signal in the pixel is started simultaneously and ends simultaneously for all effective pixels.

Since the detection circuits 52 are connected to a plurality of pixels via the output signal line 36, sampling of the output thereof is sequentially performed for each row. With respect to sampling, sampling of a reset signal corresponding to a dark state where light is not incident and sampling of an accumulated signal that has undergone exposure are performed, and a difference thereof is obtained so that correlated double sampling (CDS) for offsetting various kinds of noise is performed.

<First Operation Sequence>

An operation sequence of the pixel 100 (the pixel array unit including the pixels 100) shown in FIGS. 1 and 2 will be described with reference to FIG. 3.

The row drive circuit 50 controls both the transfer transistor 25 and the first reset transistor 27 to be turned on at time T11 immediately before the accumulation period. By this control, all of the charge accumulated in the accumulation node 22 between the photodiode 21 and the transfer transistor 25 is discharged to the power supply 23 via the first detection node 28. This control is hereinafter referred to as "photo diode (PD) reset".

The row drive circuit 50 controls the transfer transistor 25 to be turned off at time T12 after the time T11. The period from the time T11 to the time T12 is described as a PD reset period. By this control, the accumulation node 22 is in a floating state, and accumulation of new charges is started.

Moreover, the row drive circuit 50 controls the first reset transistor 27 to be turned off at time T13 after the PD reset. By this control, the potential of the first detection node 28 is coupled to the gate of the first reset transistor 27 and is somewhat lowered from the reference potential to be in a floating state.

Moreover, at this time, significant kTC noise is generated at the first detection node 28. Since the floating diffusion (floating) is generally used as the first detection node 28, this control is hereinafter referred to as "FD reset", and the period during which the FD reset is performed is described as an FD reset period.

In the first operation sequence, the PD reset and the FD reset are performed consecutively. These operations are performed simultaneously for all the effective pixels 100.

On the other hand, the gate of the load transistor 29 is fixed within the saturation operation region and constitutes a source follower circuit, together with the first amplification transistor 26. As a result, the potential of the output node 24 of the first stage of each pixel reflecting the reset signal is decided.

Next, sampling of the reset signal is sequentially performed with respect to the pixel 100 for each row. The sampling of the reset signal is handled as the first reading in the correlated double sampling.

At time T14, row selection is performed, the pixel 100 and the output signal line 36 are connected by the selection transistor 34, the voltage of the second detection node 32 is amplified by the second amplification transistor 33, and is output to the output signal line 36. The voltage of the second detection node 32 output to the output signal line 36 is compared with the reference voltage Ref1 by the differential amplification circuit 53, and the feedback signal line 54 is driven in reverse phase.

At the same time, the second reset transistor 35 is turned on in the selected row, and an offset charge is generated in the coupling capacitor 31 so that the signal from the output signal line 36 and the reference signal Ref1 can be balanced. The second reset transistor is turned off, so that the potential of the second detection node 32 is coupled to the gate of the second reset transistor 35 and is somewhat lowered to be in a floating state. Moreover, at this time, significant kTC noise is generated at the second detection node 32.

The detection circuit 52 performs sampling at least once (for example, four times). In these sampling operations, the signal of the potential of the output signal line 36 is converted into a digital signal Ds11 by the detection circuit 52 as the reset signal of the pixel 100. The value of the digital signal Ds11 is stored in a register in the detection circuit 52, for example.

This sampling of the reset signal is repeated for the pixels 100 in each row. Reset signals Ds11 to Ds1n of each pixel sharing each detection circuit 52 are stored in each detection circuit 52. Since the storage amount of these as the whole corresponds to the total number of pixels, field memories may be installed in the chip or outside the chip, and the reset signals Ds11 to Ds1n may be stored therein.

The row drive circuit 50 controls the transfer transistor 25 to be turned on at time T16 immediate before the end of the accumulation period. By this control, the charge accumulated in the accumulation node 22 is transferred to the first detection node 28. At this time, if the potential of the first detection node 28 is sufficiently deep, the electrons accumulated in the accumulation node 22 are all transferred to the first detection node 28, and the accumulation node 22 is in a fully depleted state.

At time T17 after the pulse period has elapsed from the time T16 (after the charge transfer period has elapsed), the row drive circuit 50 controls the transfer transistor 25 to be turned off. As a result of this control, the potential of the first detection node 28 decreases by an amount corresponding to the accumulated charge amount (in other words, the potential becomes shallower) as compared with before the transfer transistor 25 is driven. These operations are simultaneously performed for all the effective pixels 100, so that the potential of the output node 24 of the first stage of each pixel reflecting the accumulated signal is decided.

Next, in the sampling period of the accumulated signal, sampling of the accumulated signal is sequentially performed for each row with respect to the pixel 100. The sampling of the accumulated signal is handled as the second reading in the correlated double sampling.

At time T18, row selection is performed, the pixel 100 and the output signal line 36 are connected by the selection transistor 34, the voltage of the amount of the decrease described above is amplified by the second amplification transistor 33, and is output to the output signal line 36.

Here, the detection circuit 52 performs sampling at least once (for example, four times). In these sampling operations, the signal of the potential of the output signal line 36 is converted into a digital signal Ds21 by the detection circuit 52 as the accumulated signal of the pixel.

The detection circuit 52 compares the sampled accumulated signal (that is, the digital signal Ds21) with the reset signal (that is, the digital signal Ds11) and determines the incident photon amount on the basis of the comparison result. The kTC noise in the output of the second stage is offset by setting the difference between the digital signal Ds11 and the digital signal Ds21 as a net accumulated signal. The digital detection result obtained by obtaining the CDS in this manner is sequentially transmitted to the output circuit 58 and output to the outside.

This sampling and output of the accumulated signal is repeated for the pixels 100 in each row.

Here, the exposure accumulation period of each pixel 100 is a period between the PD reset operation and the accumulated signal reading operation described above. To be exact, the exposure accumulation period of each pixel 100 is the period from when the transfer transistor 25 is turned off after the reset, until the transfer transistor 25 is turned off for reading. When a photon enters the photodiode 21 during this exposure accumulation period and charges are generated, the generated charge amount is a difference between the reset signal and the accumulated signal and is derived by the detection circuit 52 according to the above-described procedure.

Since this exposure accumulation time is the same for all effective pixels, a so-called global reset is performed.

Furthermore, at the time of FD reset at the time T11, the offset including the kTC noise, the feedthrough, the Vth variation and the like generated in the output (output node 24) from the amplifier of the first stage is all canceled by the input reset of the amplifier of the second stage at the time T14. At this time, the offset remaining in the output of the amplifier of the second stage is the kTC noise and the feedthrough generated in the second detection node 32 as its input, which are canceled by the CDS process described above.

<Second Operation Sequence>

In the first operation sequence, a dead period is generated during which accumulation is not performed during a period from when the unit accumulation completed until the next accumulation is started, particularly during the sampling period of the accumulated signal. An example of eliminating such a dead period and corresponding to, for example, high-speed sampling will be described with reference to FIG. 4 as a second operation sequence.

Figure 3:
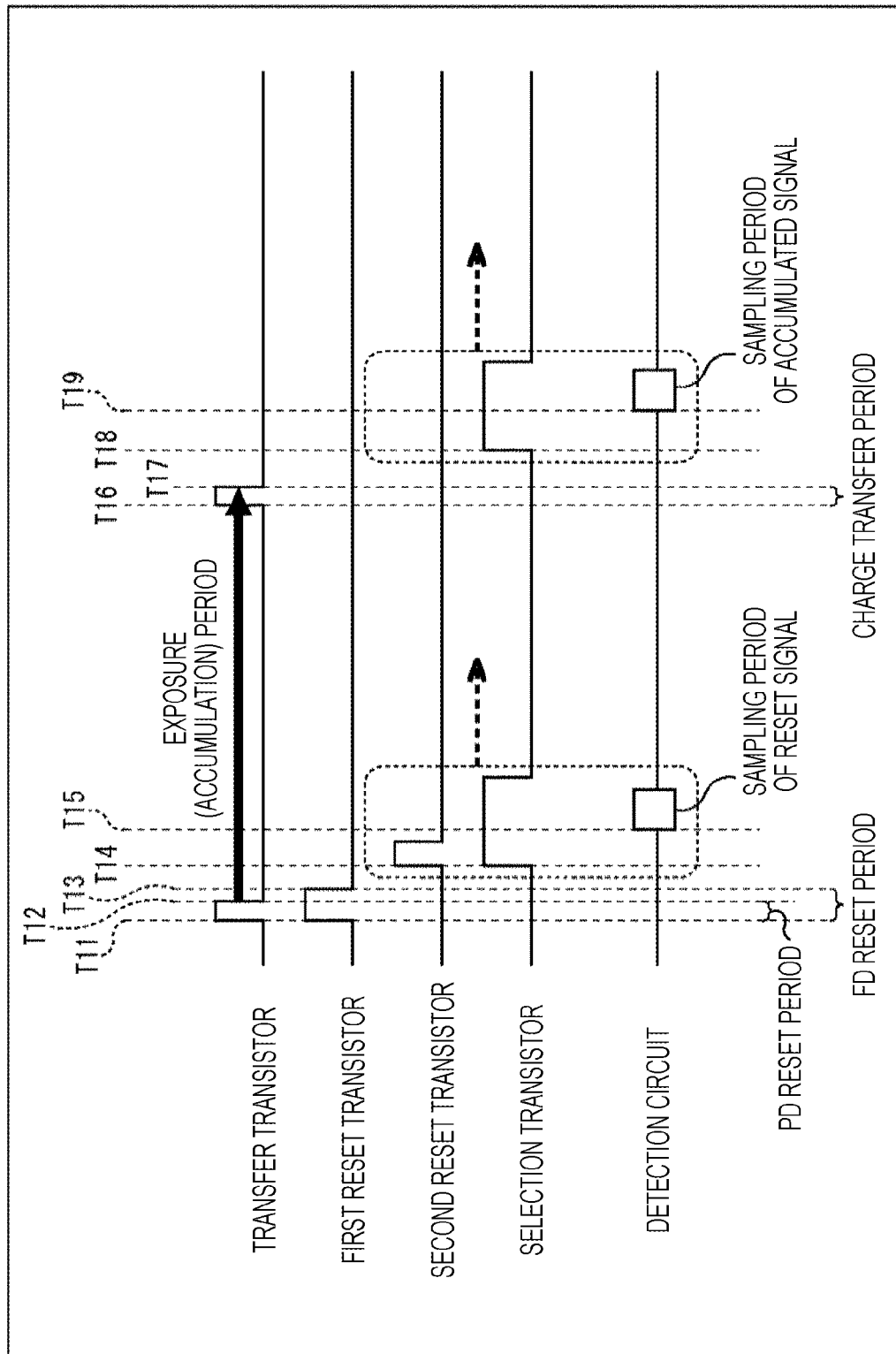
FIG. 3 is a diagram for explaining a first operation sequence.
Figure 4:
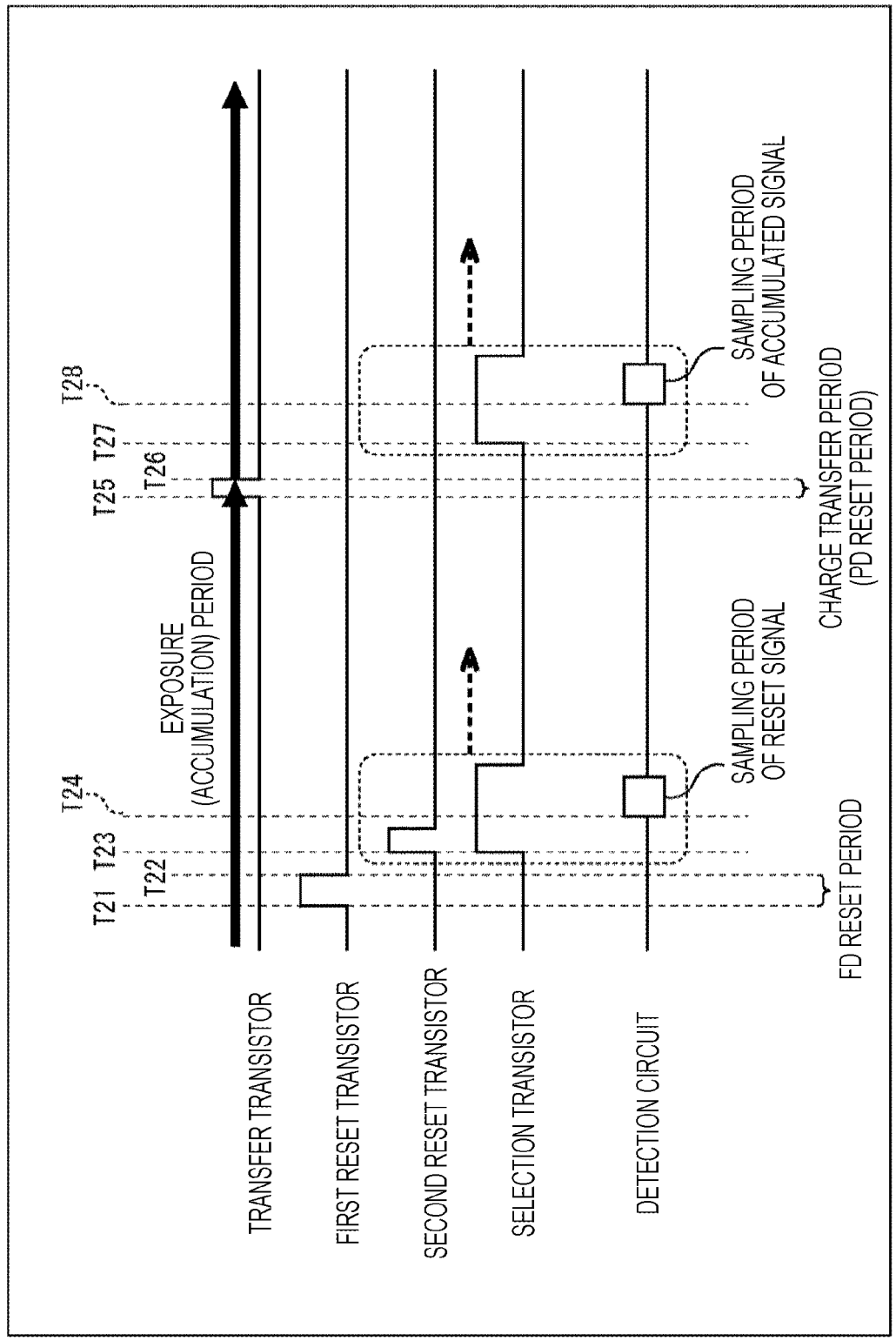
FIG. 4 is a diagram for explaining a second operation sequence.

The second operation sequence shown in FIG. 4 is different from the first operation sequence shown in FIG. 3 in that the PD reset processing performed at the time T11 is omitted, and the PD charge discharge accompanying the charge transfer at time T25 at the time of reading is performed commonly as the PD reset processing.

In other words, the first reset transistor 27 is turned on at time T21, the FD reset period is set until time T22, and the FD reset processing is performed. At the time T21, the transfer transistor 25 is not turned on. At this time, the PD reset processing is not performed.

After time T23, as in the first operation sequence, a sampling period of the reset signal is provided, and sampling of the reset signal is performed.

The accumulation period includes the FD reset period, and charge accumulation in the photodiode 21 is performed.

Thereafter, at the time T25, the transfer transistor 25 is turned on, and at time T26, turned off. The period between the time T25 and the time T26 is a charge transfer period and is a period during which the charge accumulated in the photodiode 21 is transferred to the first detection node 28. This charge transfer period also corresponds to the PD reset period, and reset processing for the photodiode 21 is also performed.

In other words, at the time T25, a pulse is applied to the transfer transistor 25 and the accumulated signal is transferred to the first detection node 28. This charge discharge is performed commonly as PD reset. At this time, the next accumulation period of the photodiode 21 is started immediately after the end of the charge transfer period (immediately after the transfer transistor 25 is turned off). As a result, the dead period during which photons incident on the pixel 100 are not detected can be made substantially zero.

<Third Operation Sequence>

In the first and second operation sequences, sampling is performed twice for the reset output and the accumulation output in order to obtain the CDS.

According to the present technology, the reset output is adjusted to a level substantially equal to the reference input Ref1 (reference voltage Ref1) by the differential amplification circuit 53, and the offset component added to the reset output can be made extremely small as described above. Therefore, in applications and the like which do not require high accuracy, even if part or all of the sampling of the reset output is omitted, it is possible to perform operation satisfying a certain degree of accuracy.

Thus, an operation sequence for omitting part or all of sampling will be described with reference to FIG. 5 as a third operation sequence.

Figure 5:
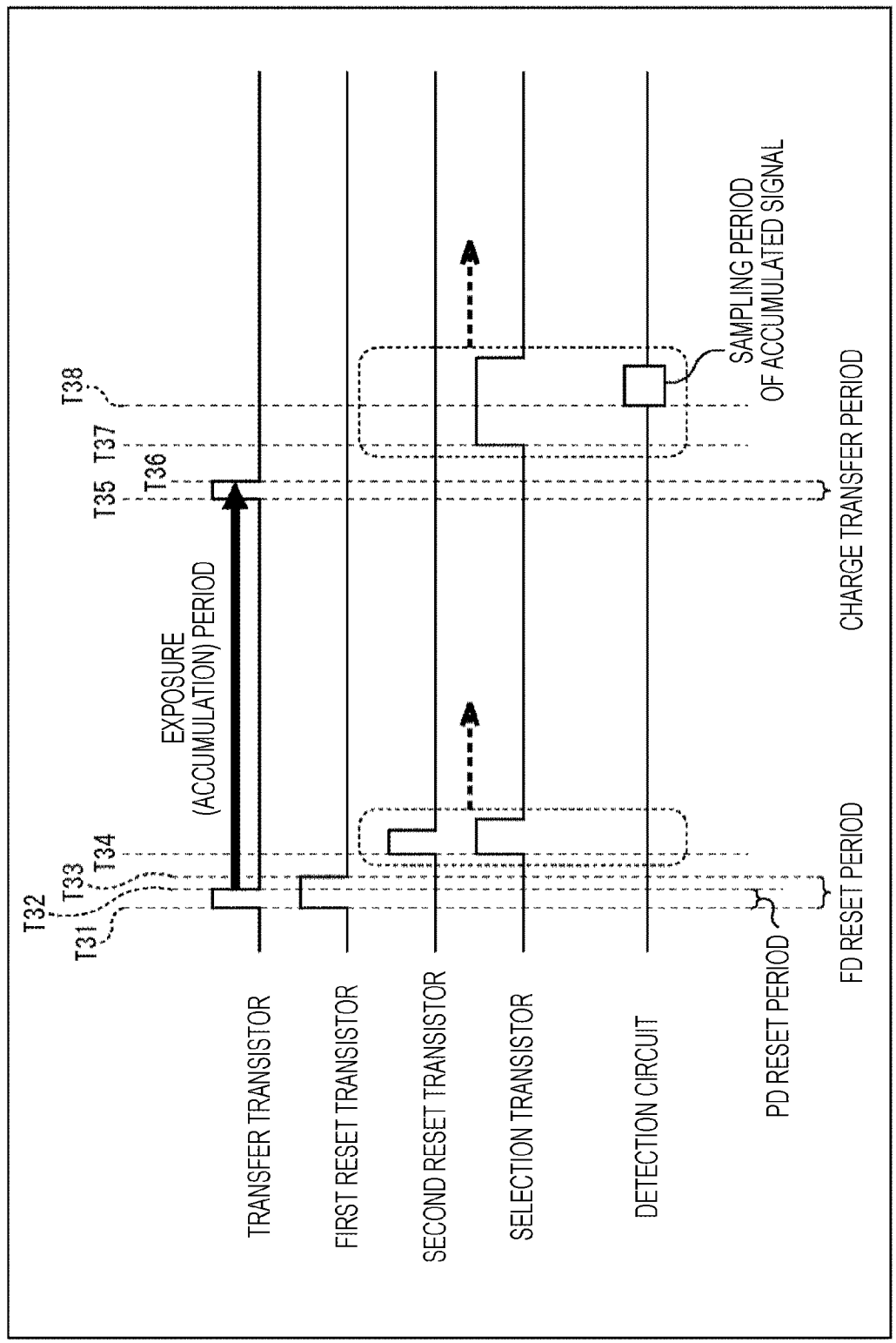
FIG. 5 is a diagram for explaining a third operation sequence.

At the time from the time T31 to the time T33 in the third operation sequence shown in FIG. 5, PD reset and FD reset are performed in the same manner as in the first operation sequence. Thereafter, in the first and second operation sequences, sampling of the reset signal is performed. However, in the third operation sequence, sampling of the reset signal is not performed.

In other words, in the third operation sequence, at time T34, only the row selection and the input reset to the second amplification transistor 33 of the second stage are performed, and signal sampling is not performed.

Alternatively, processing may be performed in which only one to several lines are sampled and the output average value is regarded as a reset signal. In other words, the processing may be performed by handling all the output of the reset signal as uniform.

For all the effective pixels, sampling of the accumulated signal at time T38 is performed.

In the case of such a third operation sequence, since the number of times of AD conversion can be reduced to about half, there are advantages that the third operation sequence can contribute to a higher frame rate and lower power consumption, and a register and a memory for storing a reset signal are not necessary.

Note that the second operation sequence may be applied to the third operation sequence so that a sequence can be used commonly for charge transfer and PD reset.

Configuration of Imaging Element in Second Embodiment

Figure 6:
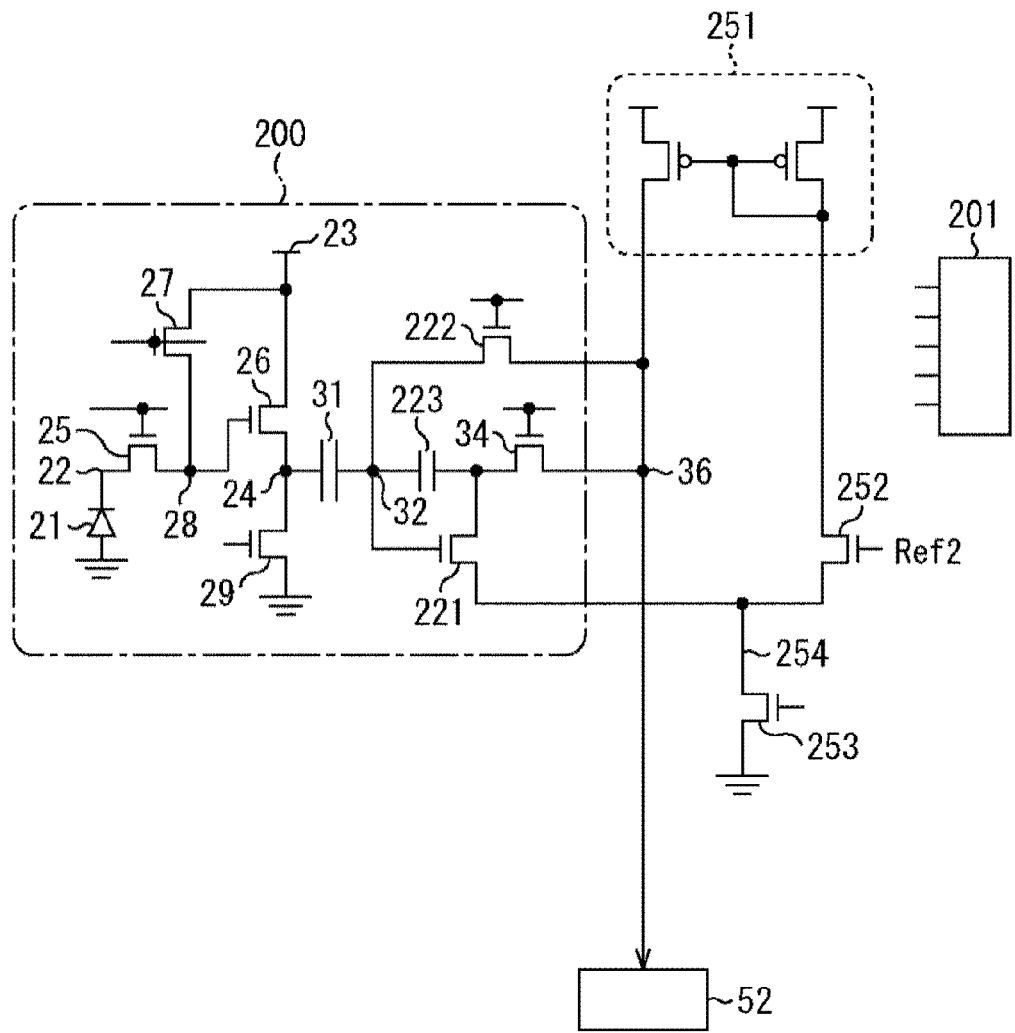
FIG. 6 is a diagram showing a configuration of an imaging element according to a second embodiment.

The configuration of an imaging element in a second embodiment will be described. FIG. 6 shows a configuration of an imaging element (pixel 200) according to the second embodiment.

In the following description, in the pixel 100 in the first embodiment shown in FIG. 1 and in the pixel 200 in the second embodiment shown in FIG. 6, the same reference numerals are given to the same parts, and the description thereof will be omitted as appropriate.

The pixel 200 shown in FIG. 6 includes the photodiode 21, the cathode (accumulation node) 22, the power supply 23, the output node 24, the transfer transistor 25, the first amplification transistor 26, the first reset transistor 27, the first detection node 28, the load transistor 29, the coupling capacitor 31, the second detection node (input node) 32, the selection transistor 34, and the output signal line 36. The configuration up to this point is similar to the pixel 100.

The pixel 200 further includes a second amplification transistor 221, a second reset transistor 222, and a capacitor 223. Furthermore, the pixel 200 is connected with a row drive circuit 201, a current mirror circuit 251, a reference voltage input amplification transistor 252, a current/operating point adjusting transistor 253, and a source line 254.

In the same manner as the other transistors, the second amplification transistor 221, the second reset transistor 222, the reference voltage input amplification transistor 252, and the current/operating point adjusting transistor 253 may be, for example, an n type MOS transistor or a p type transistor.

In the pixel 200 in the second embodiment, the amplifier configuration of the second stage of the pixel 100 in the first embodiment is changed. In other words, in the pixel 200, the circuit configuration from the photodiode 21 to the output of the output node 24 of the first stage (amplifier output), and existence of the coupling capacitor 31 accumulating offset charges, and the second detection node 32 of the second stage (input of the amplifier) are similar to the pixel 100 in the first embodiment.

While the second amplification transistor 33 (FIG. 1) of the pixel 100 in the first embodiment constitutes a source follower, the second amplification transistor 221 of the pixel 200 in the second embodiment constitutes a differential amplification circuit, together with the current mirror circuit 251, the reference voltage input amplification transistor 252 paired with the second amplification transistor 221, and the current/operating point adjusting transistor 253 of which gate is connected to an appropriate fixed voltage.

Moreover, the output from the constituted differential amplifier circuit (output to the output signal line 36) is fed back in reverse phase to the second detection node 32 (input node 32) via the second reset transistor 222.

Figure 7:
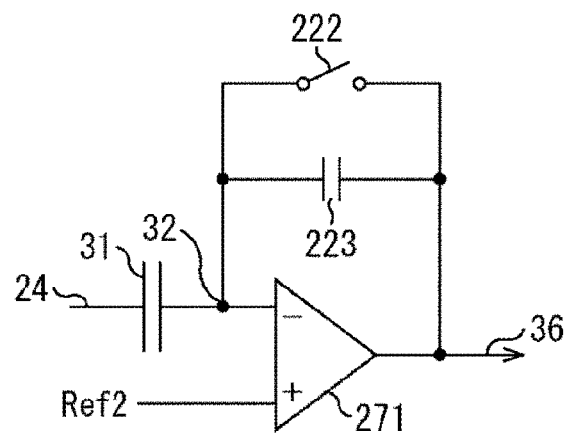
FIG. 7 is a diagram showing a configuration of a pixel array.

In other words, the differential amplifier circuit (hereinafter referred to as a differential amplification circuit 271) including the pixel 200 in the second embodiment constitutes an equivalent circuit as shown in FIG. 7, with each element in the pixel. Referring to the equalization circuit shown in FIG. 7, if the second reset transistor 222 is turned on, a voltage follower of a reference signal Ref2 (reference voltage Ref2) is formed, and a signal having the same level as the reference signal Ref2 is output to the pixel output 36.

Regardless of the offset occurring in the output of the output node 24 of the first stage of the pixel and the threshold offset of the second amplification transistor 221, the pixel output 36 is fixed to substantially the same level as the reference signal Ref2, and the offset charge adjusting the pixel output 36 is stored in the coupling capacitor 31.

Moreover, if the second reset transistor 222 is turned off, the displacement of the output node 24 (amplifier output) of the first stage of the pixel 200 is amplified according to the capacitance ratio of the coupling capacitor 31 and the capacitor 223, and is transmitted to the pixel output 36.

The amplifier element of the second stage of the pixel 100 in the first embodiment (the second amplification transistor 33) is the source follower, and only the amplification smaller than 1 can be obtained, while, with the amplification element of the second stage of the pixel 200 in the second embodiment (the second amplification transistor 221), for example, more than twice amplification can be obtained. Accordingly, the pixel conversion efficiency can be improved. Furthermore, the influence of noise of the detection circuit 52 connected to the subsequent stage can be relaxed relatively for the improved amount.

Note that the row drive circuit 201 drives each of the gates of the transfer transistor 25, of the first reset transistor 27, the second reset transistor 222, and the selection transistor 34 in parallel, with respect to a plurality of pixels arranged in the row direction. Alternatively, as similar to the first embodiment, the gate of the load transistor 29 can also be configured to be driven as required.

<Configuration of Pixel Array>

Figure 8:
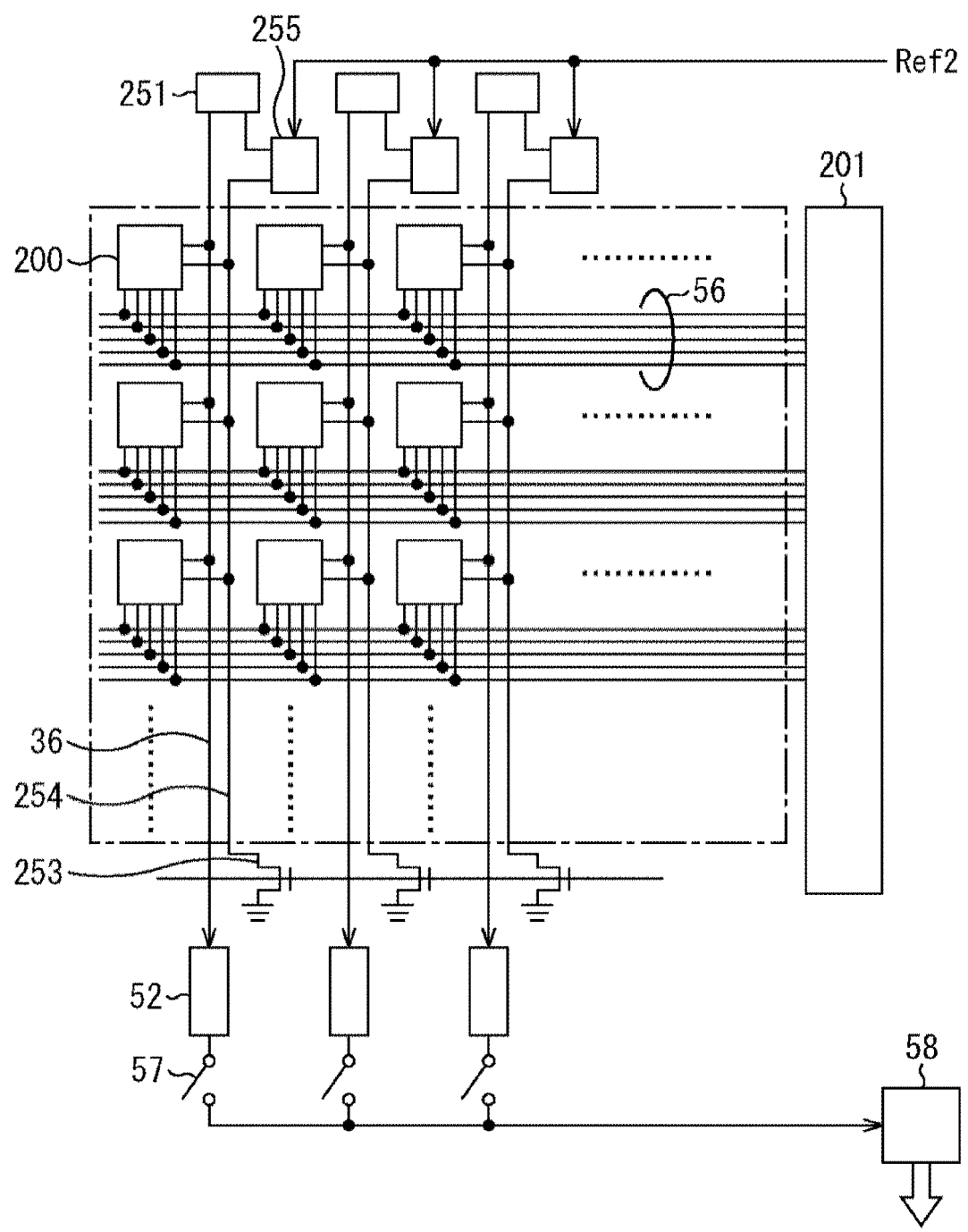
FIG. 8 is a diagram showing an equalization circuit.

FIG. 8 shows a configuration example of a pixel array unit in which the pixels 200 shown in FIG. 6 are arrayed.

The detection circuit 52 is connected to a plurality of pixels 200 arranged in the column direction via the output signal line 36. Pixels to be read are alternatively selected by the selection transistor 34 in the pixels in FIG. 6.

One current mirror circuit 251 is arranged in each column, and a dummy pixel 255 including the reference voltage input amplification transistor 252 for reference is arranged for each column. The dummy pixel 255 forms an input unit of the differential amplification circuit 271 in pairs with the selected pixel 200, and the transistor size and the circuit configuration are determined so that the characteristics are similar to those of the selected pixel.

The reference voltage input amplification transistor 252 preferably has the same size as the second amplification transistor 221. Furthermore, for example, since the selection transistor 34 is inserted in the selection pixel 200, a transistor having the same size may be inserted in the dummy pixel 255.

The second amplification transistor 221 of the pixel 200 arranged in line and the source of the current/operating point adjusting transistor 253 of the dummy pixel 255 are connected to the source line 254 of each column, and is connected to the ground via the current/operating point adjusting transistor 253.

Moreover, the row drive circuit 201 is shared by the plurality of pixels 200 arranged in the row direction via drive signal lines 56. The drive signal lines 56 are connected to the gates of the transfer transistor 25, the first reset transistor 27, the load transistor 29, the selection transistor 34, and the second reset transistor 222 in the pixel 200, respectively, and simultaneously drive the gates of the plurality of pixels for each row.

Reading of a signal from the pixel 200 is performed in parallel with respect to the plurality of pixels for each row, and the signal is detected in parallel by a plurality of detection circuits 52 and subjected to AD conversion.

Moreover, feedback of a signal at the time of the second reset is also performed in parallel with respect to a plurality of pixels for each row, and a feedback signal is supplied in parallel by a plurality of differential amplifications.

The output signals of a plurality of pixels detected simultaneously by the plurality of detection circuits 52 on a row basis and subjected to AD conversion are sequentially connected to an output circuit 58 by a switch 57, and serially output to the outside.

<Fourth Operation Sequence>

An operation sequence of the pixel 200 (the pixel array unit including the pixels 200) shown in FIGS. 6 and 8 (referred to as a fourth operation sequence) will be described with reference to FIG. 9.

Similarly to the first to third operation sequences (operation sequence in the pixel 100 of the first embodiment), also in the fourth operation sequence (operation sequence in the pixel 200 of the second embodiment), described as an example is a case of applying a so-called global shutter in which accumulation of a photoelectric conversion signal in the pixel is started simultaneously for all effective pixels and ends simultaneously.

Since the detection circuits 52 are connected to a plurality of pixels via the output signal line 36, sampling of the output thereof is sequentially performed for each row. With respect to sampling, sampling of a reset signal corresponding to a dark state where light is not incident and sampling of an accumulated signal that has undergone exposure are performed, and a difference thereof is obtained so that correlated double sampling (CDS) for offsetting various kinds of noise is performed.

The row drive circuit 201 controls both the transfer transistor 25 and the first reset transistor 27 to be turned on at time T51 immediately before the accumulation period. By this control, all of the charge accumulated in the accumulation node 22 between the photodiode 21 and the transfer transistor 25 is discharged to the power supply 23 via the first detection node 28. In other words, PD reset is performed.

The row drive circuit 201 controls the transfer transistor 25 to be turned off at time T52 after the time T51. The period from the time T51 to the time T52 is described as a PD reset period. By this control, the accumulation node 22 is in a floating state, and accumulation of new charges is started.

Moreover, the row drive circuit 201 controls the first reset transistor 27 to be turned off at time T53 after the PD reset. By this control, the potential of the first detection node 28 is coupled to the gate of the first reset transistor 27 and is somewhat lowered from the reference potential to be in a floating state.

Moreover, at this time, significant kTC noise is generated at the first detection node 28. Since the floating diffusion (floating) is generally used as the first detection node 28, this control is hereinafter referred to as "FD reset", and the period during which the FD reset is performed is described as an FD reset period.

In the fourth operation sequence, the PD reset and the FD reset are performed consecutively. These operations are performed simultaneously for all the effective pixels 200.

On the other hand, the gate of the load transistor 29 is fixed within the saturation operation region and constitutes a source follower circuit, together with the first amplification transistor 26. As a result, the potential of the output node 24 of the first stage of each pixel reflecting the reset signal is decided.

Next, sampling of the reset signal is sequentially performed with respect to the pixel 200 for each row. The sampling of the reset signal is handled as the first reading in the correlated double sampling.

At time T54, row selection is performed, the pixel 200 and the output signal line 36 are connected by the selection transistor 34, the voltage of the second detection node 32 is amplified by the second amplification transistor 221, and is output to the output signal line 36.

At this time, the source line 254 of the second amplification transistor 221 is connected to the ground via the current/operating point adjusting transistor 253, and the drain side is the pixel output 36. These constitute a part of the differential amplifier circuit, and the input of the second amplification transistor 221 (the signal from the second detection node 32) is compared with the reference signal Ref2 so that the displacement of the pixel output 36 becomes reverse phase and is amplified.

Here, if the second reset transistor 222 is turned on, the pixel output 36 is fed back to the second detection node 32 to constitute a voltage follower as described above, and the pixel output 36 is fixed to have the same potential as the reference signal Ref2.

Moreover, the second reset transistor 222 is turned off, so that the potential of the second detection node 32 is coupled to the gate of the second reset transistor 222 and is somewhat lowered to be in a floating state. Moreover, at this time, significant kTC noise is generated at the second detection node 32.

The detection circuit 52 performs sampling at least once (for example, four times). In these sampling operations, the signal of the potential of the output signal line 36 is converted into a digital signal Ds11 by the detection circuit 52 as the reset signal of the pixel 200. The value of the digital signal Ds11 is stored in a register in the detection circuit 52, for example.

This sampling of the reset signal is repeated for the pixels 200 in each row. Reset signals Ds11 to Ds1n of each pixel sharing each detection circuit 52 are stored in each detection circuit 52. Since the storage amount of these as the whole corresponds to the total number of pixels, field memories may be installed in the chip or outside the chip, and the reset signals Ds11 to Ds1n may be stored therein.

The row drive circuit 201 controls the transfer transistor 25 to be turned on at time T56 immediate before the end of the accumulation period. By this control, the charge accumulated in the accumulation node 22 is transferred to the first detection node 28. At this time, if the potential of the first detection node 28 is sufficiently deep, the electrons accumulated in the accumulation node 22 are all transferred to the first detection node 28, and the accumulation node 22 is in a fully depleted state.

At time T57 after the pulse period has elapsed from the time T56 (after the charge transfer period has elapsed), the row drive circuit 201 controls the transfer transistor 25 to be turned off. As a result of this control, the potential of the first detection node 28 decreases by an amount corresponding to the accumulated charge amount (in other words, the potential becomes shallower) as compared with before the transfer transistor 25 is driven. These operations are simultaneously performed for all the effective pixels 200, so that the potential of the output node 24 of the first stage of each pixel reflecting the accumulated signal is decided.

Next, in the sampling period of the accumulated signal, sampling of the accumulated signal is sequentially performed for each row with respect to the pixel 200. The sampling of the accumulated signal is handled as the second reading in the correlated double sampling.

At time T58, row selection is performed, the pixel 200 and the output signal line 36 are connected by the selection transistor 34, the voltage of the amount of the decrease described above is amplified by the second amplification transistor 221, and is output to the output signal line 36.

Here, the detection circuit 52 performs sampling at least once (for example, four times). In these sampling operations, the signal of the potential of the output signal line 36 is converted into a digital signal Ds21 by the detection circuit 52 as the accumulated signal of the pixel.

The detection circuit 52 compares the sampled accumulated signal (that is, the digital signal Ds21) with the reset signal (that is, the digital signal Ds11) and determines the incident photon amount on the basis of the comparison result. The kTC noise in the output of the second stage is offset by setting the difference between the digital signal Ds11 and the digital signal Ds21 as a net accumulated signal. The digital detection result obtained by obtaining the CDS in this manner is sequentially transmitted to the output circuit 58 and output to the outside.

This sampling and output of the accumulated signal is repeated for the pixels 200 in each row.

Here, the exposure accumulation period of each pixel 200 is a period between the PD reset operation and the accumulated signal reading operation described above. To be exact, the exposure accumulation period of each pixel 200 is the period from when the transfer transistor 25 is turned off after the reset, until the transfer transistor 25 is turned off for reading. When a photon enters the photodiode 21 during this exposure accumulation period and charges are generated, the generated charge amount is a difference between the reset signal and the accumulated signal and is derived by the detection circuit 52 according to the above-described procedure.

Since this exposure accumulation time is the same for all effective pixels, a so-called global reset is performed.

Furthermore, at the time of FD reset at the time T51, the offset including the kTC noise, the feedthrough, the Vth variation and the like generated in the amplifier output 24 of the first stage is canceled by the input reset of the amplifier of the second stage at the time T54. At this time, the offset remaining in the output of the amplifier of the second stage is the kTC noise and the feedthrough generated in the second detection node 32 as its input, which are canceled by the CDS process described above.

<Fifth Operation Sequence>

In the fourth operation sequence, a dead period is generated during which accumulation is not performed during a period from when the unit accumulation is completed until the next accumulation is started, particularly during the sampling period of the accumulated signal. An example of eliminating such a dead period and corresponding to, for example, high-speed sampling will be described with reference to FIG. 10 as a fifth operation sequence.

Figure 9:
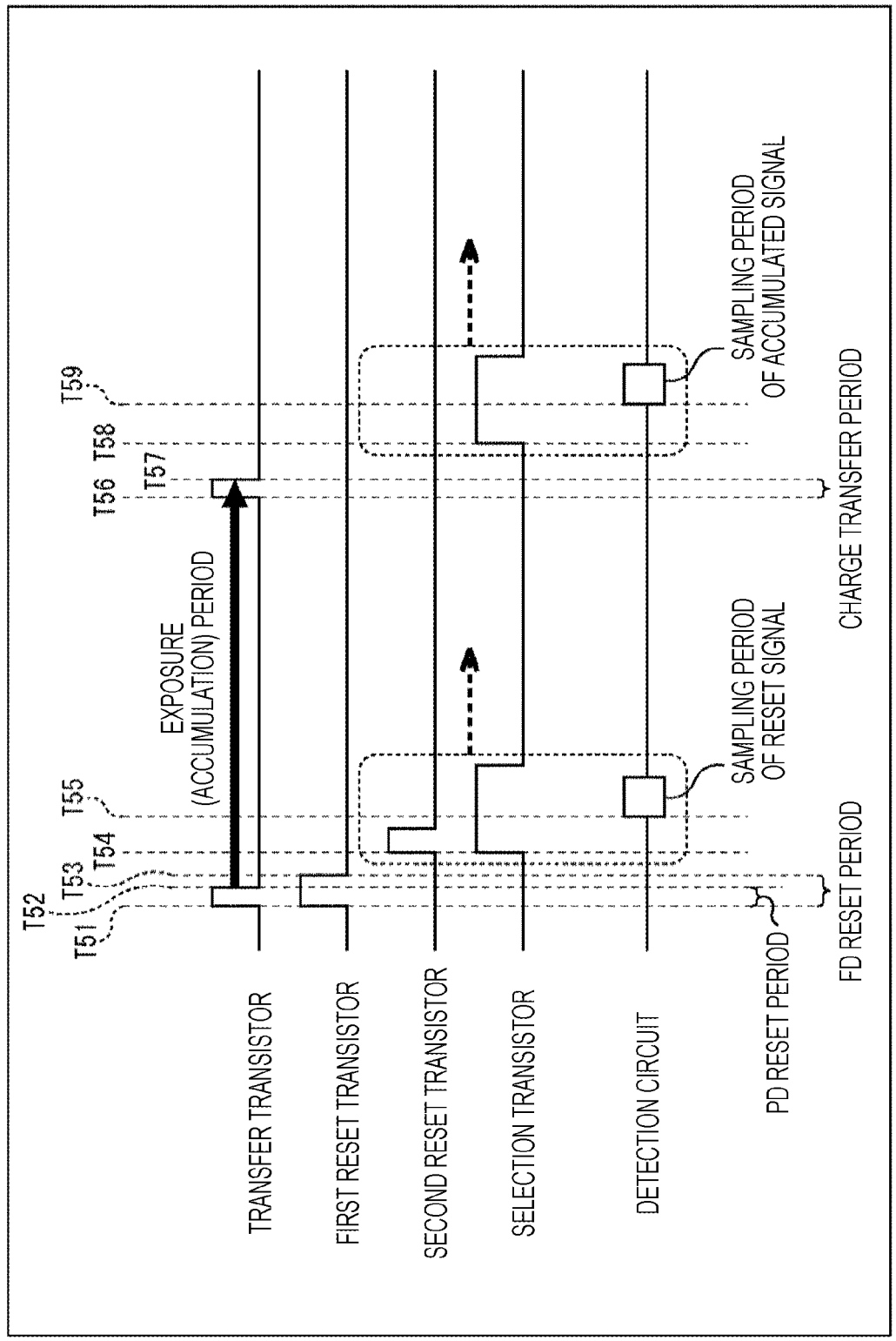
FIG. 9 is a diagram for explaining a fourth operation sequence.
Figure 10:
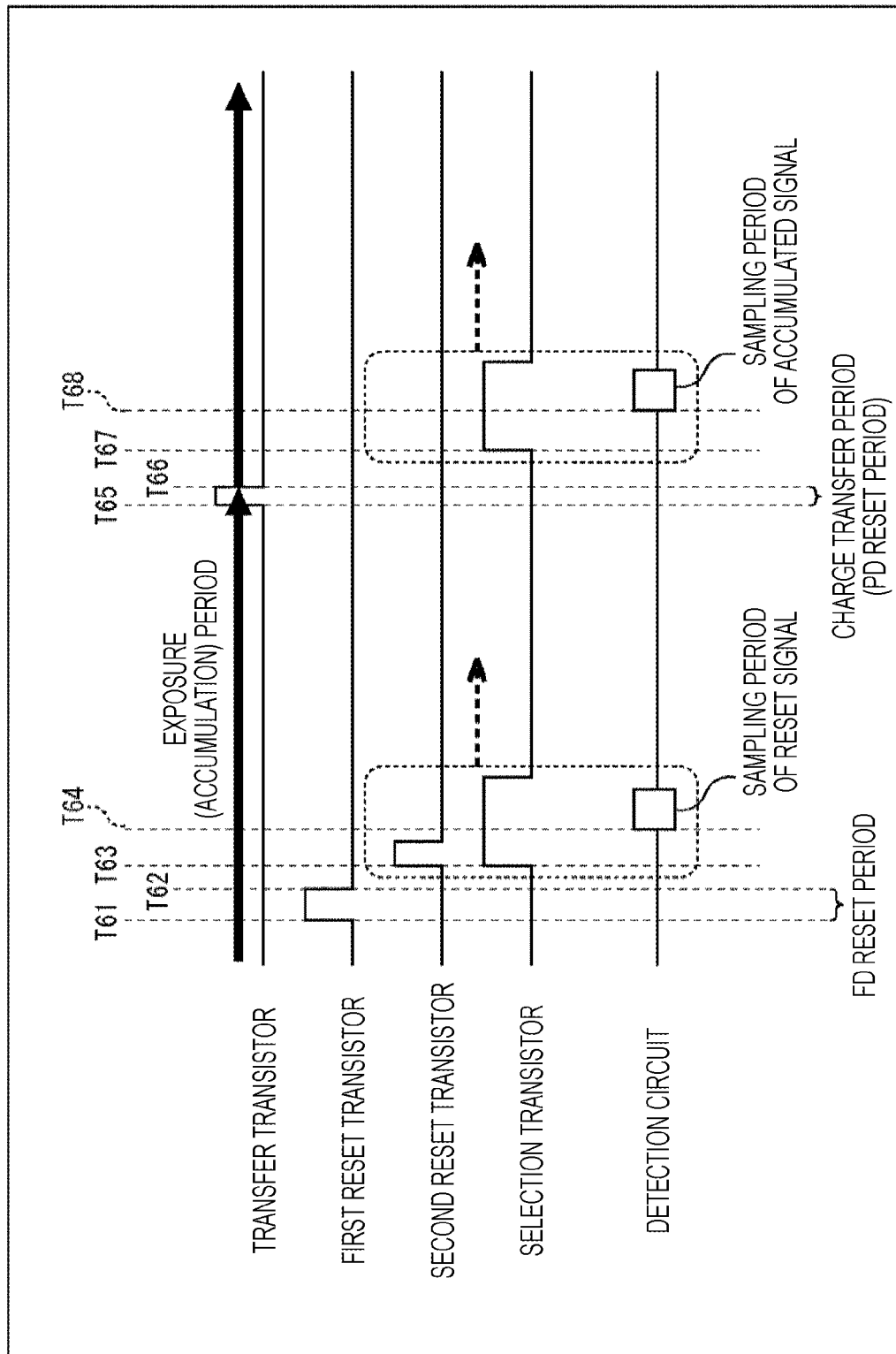
FIG. 10 is a diagram for explaining a fifth operation sequence.

The fifth operation sequence shown in FIG. 10 is different from the fourth operation sequence shown in FIG. 9 in that the PD reset processing performed at the time T51 is omitted, and the PD charge discharge accompanying the charge transfer at time T64 at the time of reading is performed commonly with the PD reset processing.

In other words, the first reset transistor 27 is turned on at time T61, the FD reset period is set until time 162, and the FD reset processing is performed. At the time T61, the transfer transistor 25 is not turned on and PD reset processing is not performed.

After time 163, as in the fourth operation sequence, a sampling period of the reset signal is provided, and sampling of the reset signal is performed.

The accumulation period includes the FD reset period, and charge accumulation in the photodiode 21 performed.

Thereafter, at the time 165, the transfer transistor 25 is turned on, and at time 166, turned off. The period between the time 165 and the time 166 is a charge transfer period and is a period during which the charge accumulated in the photodiode 21 is transferred to the first detection node 28.

This charge transfer period also corresponds to the PD reset period, and reset processing for the photodiode 21 is also performed.

In other words, at the time 165, a pulse is applied to the transfer transistor 25 and the accumulated signal is transferred to the first detection node 28. This charge discharge is performed commonly with PD reset. At this time, the next accumulation period of the photodiode 21 is started immediately after the end of the charge transfer period. As a result, the dead period during which photons incident on the pixel 200 are not detected can be made substantially zero.

<Sixth Operation Sequence>

In the fourth and fifth operation sequences, sampling is performed twice for the reset output and the accumulation output in order to obtain the CDS.

According to the present technology, the reset output is adjusted to a level substantially equal to the reference signal Ref2 by the differential amplification circuit 271 (FIG. 7) (a circuit including the current mirror circuit 251 and the like included in the differential amplification circuit 271), and the offset component added to the reset output can be made extremely small as described above. Therefore, in applications and the like which do not require high accuracy, even if part or all of the sampling of the reset output is omitted, it is possible to perform operation satisfying a certain degree of accuracy.

Thus, an operation sequence for omitting part or all of sampling will be described with reference to FIG. 11 as a sixth operation sequence.

Figure 11:
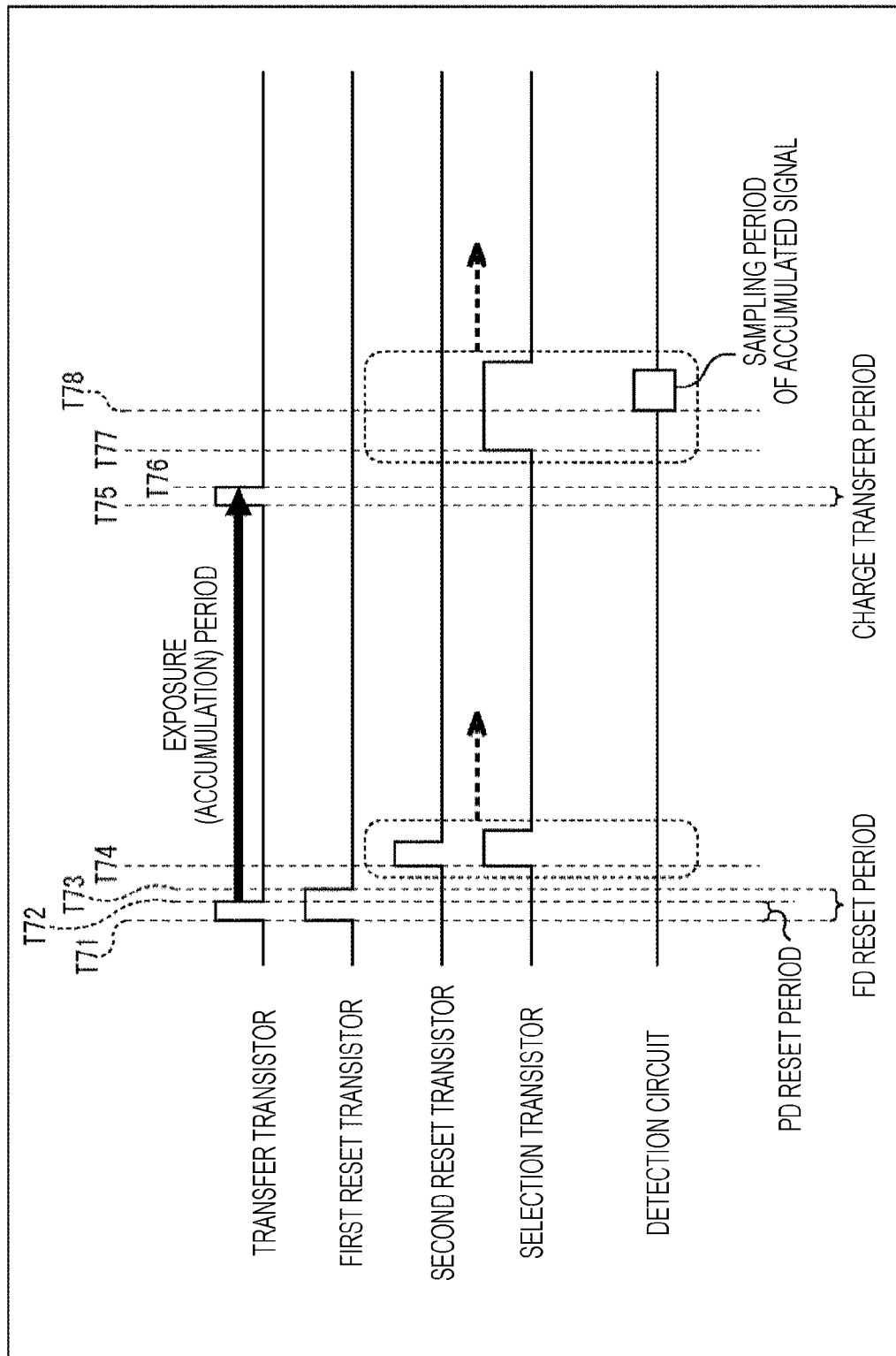
FIG. 11 is a diagram for explaining a sixth operation sequence.

At the time T71 to the time T73 in the sixth operation sequence shown in FIG. 11, PD reset and FD reset are performed in the same manner as in the fourth operation sequence. Thereafter, in the fourth and fifth operation sequences, sampling of the reset signal is performed. However, in the sixth operation sequence, sampling of the reset signal is not performed.

In other words, in the sixth operation sequence, at time 174, only the row selection and the input reset to the second amplification transistor 221 of the second stage are performed, and signal sampling is not performed.

Alternatively, processing may be performed in which only one to several lines are sampled and the output average value is regarded as a reset signal. In other words, the processing may be performed by handling the output of the reset signal as uniform.

For all the effective pixels, sampling of the accumulated signal at time 178 is performed.

In the case of such a sixth operation sequence, since the number of times of AD conversion can be reduced to about half, there are advantages that the sixth operation sequence can contribute to a higher frame rate and lower power consumption, and a register and a memory for storing a reset signal are not necessary.

Note that the fifth operation sequence may be applied to the sixth operation sequence so that a sequence can be used commonly for charge transfer and PD reset.

<Pixel in Stacked Structure>

In this way, the pixel has two stages of amplifiers and negative feedback based on the output signal of the pixel is performed on the amplifier input of the second stage, it is possible to greatly reduce the offset amount in the output signal of each pixel.

Meanwhile, the offset capacitor of the second stage (for example, the coupling capacitor 31 shown in FIG. 1) and the amplifier element (for example, the second amplification transistor 33 shown in FIG. 1, or the like) may be a cause of increase in the pixel occupation area. Thus, the pixel may be formed in a different silicon layer by a stacked structure so that the size of the pixel itself does not become large.

Figure 12:
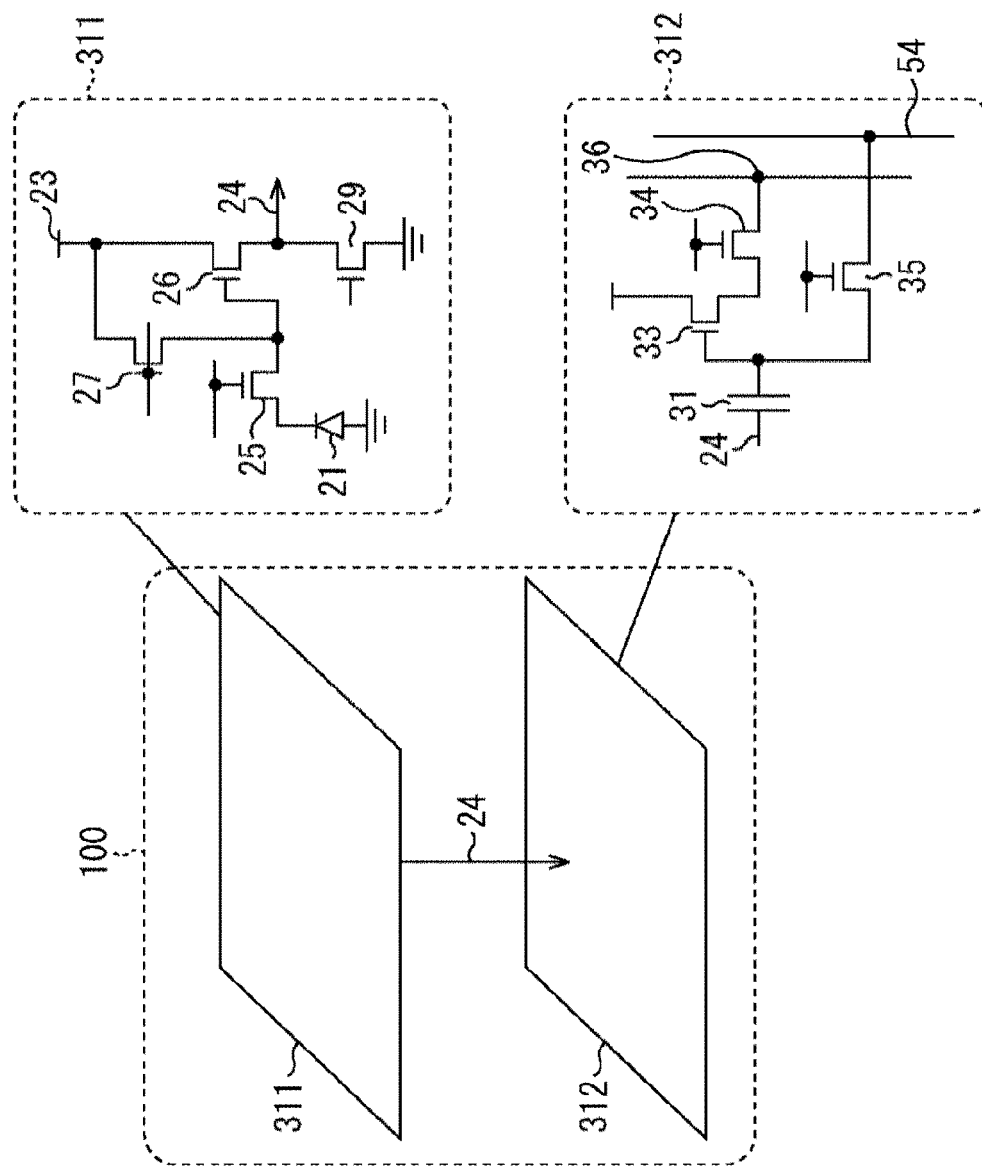
FIG. 12 is a diagram showing a configuration of an imaging element in a stacked structure.

FIG. 12 shows an example of a pixel structure in a stacked structure. In FIG. 12, the case where the pixel 100 shown in FIG. 1 is in a stacked structure will be described as an example. However, in the case where the pixel 200 shown in FIG. 6 is in a stacked structure, basically the similar configuration can be made.

The pixel 100 is formed by stacking a first silicon layer 311 and a second silicon layer 312. A circuit up to the amplifier output of the first stage including the photodiode 21 is formed in the first silicon layer 311.

In other words, the first silicon layer 311 is formed with a photodiode 21, an accumulation node 22, a power supply 23, an output node 24, a transfer transistor 25, a first amplification transistor 26, a first reset transistor 27, a first detection node 28, and a load transistor 29.

In a case where the photodiode 21 is of a back illuminated type, the upper side in the drawing is a light receiving surface and the metal wiring is formed downward (the side stacked with the second silicon layer 312).

The amplifier circuit of the second stage that processes the amplifier output of the first stage is formed in the second silicon layer 312. A circuit up to the amplifier output of the second stage including the coupling capacitor 31 is formed in the second silicon layer 312.

In other words, the second silicon layer 312 is formed with the coupling capacitor 31, the second detection node (input node) 32, the second amplification transistor 33, the selection transistor 34, the second reset transistor 35, part of the output signal line 36, and part of the feedback signal line 54.

The metal wiring of the second silicon layer 312 is formed above the second silicon layer 312 in the drawing so as to face the metal wiring of the first silicon layer 311. The circuit formed in the first silicon layer 311 and the circuit formed in the second silicon layer 312 are connected via the output node 24.

The circuit formed in the first silicon layer 311 and the circuit formed in the second silicon layer 312 are connected, for example, by using facing adhesion between Cu pads.

Although a relatively large parasitic capacitance is generated at the connection portion between the first silicon layer 311 and the second silicon layer 312 via vias, Cu pads and the like, according to the present configuration in which amplification up to the first stage is performed with the first silicon layer 311, it is possible to maintain high conversion efficiency and high speed operation, and it is also appropriate in terms of distribution of circuit scale.

More specifically, at least from the photodiode 21 to the first amplification transistor 26 is formed in the first silicon layer 311, and from the coupling capacitor 31 to the second amplification transistor 33 is formed in the second silicon layer 312, so that it is possible to obtain a stacked structure capable of maintaining high conversion efficiency and high speed operation.

With such a stacked configuration of silicon, it is possible to mount the second stage circuit with the same occupied area as that of the conventional pixel, and thereby, a pixel can be provided that can greatly reduce the pixel output offset and enables high-speed global reset.

Note that, although not shown in FIG. 12, a configuration may be adopted in which a layer is further stacked below the second silicon layer 312, the layer formed with a circuit including the row drive circuit 50, the load transistor 51, the detection circuit 52, the differential amplification circuit 53, and the feedback signal line 54.

Note that, in the above embodiment, the reference signal Ref1 in the pixel 100 (FIG. 1) and the reference signal Ref2 in the pixel 200 (FIG. 6) may have fixed values or variable values (values set under some conditions).

Furthermore, the above-described present technology can be applied to a shared pixel structure in which an amplification transistor, a floating diffusion (FD), or the like is shared by a plurality of photodiodes.

According to the present technology, for example, in the output signal of each pixel of the CMOS image sensor, it is possible to reduce the kTC noise and substantially eliminate the output offset accompanying variation of the element characteristics. Furthermore, this also makes the offset cancellation itself unnecessary in the reading sequence, for example.

Furthermore, in a case where the present technology is applied to the global shutter, offset cancellation is omitted, so that it is possible to prevent multiplexing of kTC noise while speeding up the access, and also to reduce the level.

Moreover, in global shutter applications requiring high accuracy, even in the case of performing kTC cancellation as described above, it is possible to minimize the offset amount to be canceled and greatly shorten the time required for AD conversion.

Application Example to In-Vivo Information Acquisition System

Figure 13:
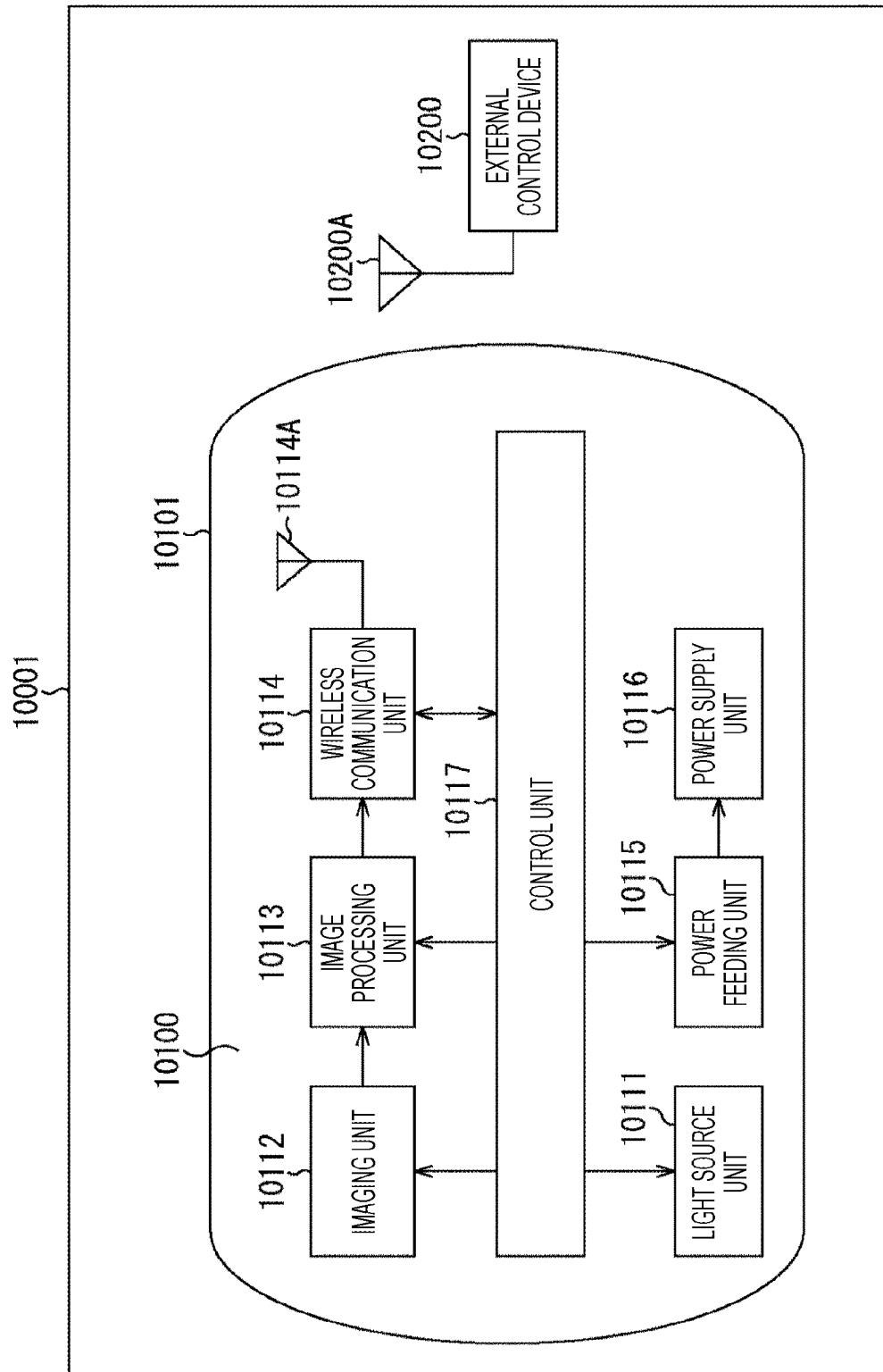
FIG. 13 is a block diagram showing an example of a schematic configuration of an in-vivo information acquisition system.

FIG. 13 is a block diagram showing an example of a schematic configuration of a patient in-vivo information acquisition system using a capsule endoscope to which the technology (the present technology) according to the present disclosure can be applied.

An in-vivo information acquisition system 10001 includes a capsule endoscope 10100 and an external control device 10200.

The capsule endoscope 10100 is swallowed by a patient at the time of examination. The capsule endoscope 10100 has an imaging function and a wireless communication function and while moving inside the internal organs such as the stomach and the intestine by peristaltic movement or the like until being naturally discharged from the patient, sequentially images the images of inside the organs (hereinafter also referred to as in-vivo images) at predetermined intervals, and sequentially wirelessly transmits the information regarding the in-vivo images to the external control device 10200 outside the body.

The external control device 10200 centrally controls the operation of the in-vivo information acquisition system 10001. Furthermore, the external control device 10200 receives information regarding the in-vivo image transmitted from the capsule endoscope 10100, and generates image data for display of the in-vivo image (not shown) in a display device (not shown) on the basis of the received information regarding the in-vivo image.

As described above, the in-vivo information acquisition system 10001 can acquire in-vivo images obtained by imaging the state of the inside of the patient from time to time until the capsule endoscope 10100 is swallowed and discharged.

The configuration and functions of the capsule endoscope 10100 and the external control device 10200 will be described in more detail.

The capsule endoscope 10100 has a capsule casing 10101, and inside the casing 10101, a light source unit 10111, an imaging unit 10112, an image processing unit 10113, a wireless communication unit 10114, a power feeding unit 10115, a power supply unit 10116, and a control unit 10117 are housed.

The light source unit 10111 includes a light source such as a light emitting diode (LED), for example, and irradiates the imaging field of view of the imaging unit 10112 with light.

The imaging unit 10112 includes an imaging element, and an optical system including a plurality of lenses provided in the prestage of the imaging element. Reflected light (hereinafter referred to as observation light) of the light emitted to a body tissue as an observation target is collected by the optical system and is incident on the imaging element. In the imaging unit 10112, observation light incident on the imaging element is photoelectrically converted, and an image signal corresponding to the observation light is generated. The image signal generated by the imaging unit 10112 is provided to the image processing unit 10113.

The image processing unit 10113 includes a processor such as a central processing unit (CPU) or graphics processing unit (CPU), and performs various signal processing on the image signal generated by the imaging unit 10112. The image processing unit 10113 provides the image signal subjected to the signal processing as RAW data to the wireless communication unit 10114.

The wireless communication unit 10114 performs predetermined processing such as modulation processing on the image signal subjected to signal processing by the image processing unit 10113 and transmits the image signal to the external control device 10200 via an antenna 10114A. Furthermore, the wireless communication unit 10114 receives a control signal related to drive control of the capsule endoscope 10100 from the external control device 10200 via the antenna 10114A. The wireless communication unit 10114 provides the control signal received from the external control device 10200 to the control unit 10117.

The power feeding unit 10115 includes an antenna coil for power reception, a power regeneration circuit that regenerates power from the current generated in the antenna coil, a booster circuit, and the like. In the power feeding unit 10115, electric power is generated using the principle of so-called non-contact charging.

The power supply unit 10116 includes a secondary battery, and stores electric power generated by the power feeding unit 10115. In FIG. 13, for the sake of avoiding complication of the drawing, the illustration of the arrow or the like indicating the destination of power supply from the power supply unit 10116 is omitted. However, the electric power stored in the power supply unit 10116 is supplied to the light source unit 10111, the imaging unit 10112, the image processing unit 10113, the wireless communication unit 10114, and the control unit 10117, and can be used for driving these units.

The control unit 10117 includes a processor such as a CPU, and appropriately controls driving of the light source unit 10111, the imaging unit 10112, the image processing unit 10113, the wireless communication unit 10114, and the power feeding unit 10115, according to a control signal transmitted from the external control device 10200.

The external control device 10200 includes a microcomputer or a control board on which processors such as a CPU, a GPU, or the like, or a processor and a storage element such as a memory are mixedly mounted. The external control device 10200 controls the operation of the capsule endoscope 10100 by transmitting a control signal to the control unit 10117 of the capsule endoscope 10100 via the antenna 10200A. In the capsule endoscope 10100, for example, the irradiation condition of light with respect to the observation target in the light source unit 10111 can be changed by a control signal from the external control device 10200. Furthermore, the imaging conditions (for example, the frame rate in the imaging unit 10112, the exposure value, or the like) can be changed by a control signal from the external control device 10200. Furthermore, the content of the processing in the image processing unit 10113 and the condition (for example, the transmission interval, the number of transmitted images, or the like) for transmission of the image signal by the wireless communication unit 10114 may be changed according to the control signal from the external control device 10200.

Furthermore, the external control device 10200 performs various image processing on the image signal transmitted from the capsule endoscope 10100, and generates image data for display of the imaged in-vivo image on the display device. Examples of the image processing include various signal processing such as development processing (demosaic processing), high image quality processing (band enhancement processing, super-resolution processing, noise reduction (NR) processing, and/or camera shake correction processing, for example), and/or enlargement processing (electronic zoom processing). The external control device 10200 controls driving of the display device to cause the in-vivo image imaged on the basis of the generated image data. Alternatively, the external control device 10200 may cause a recording device (not shown) to record the generated image data, or cause a printing device (not shown) to print out the generated image data.

An example of the in-vivo information acquisition system to which the technology according to the present disclosure can be applied has been described above. The technology according to the present disclosure can be applied to the imaging unit 10112 in the above-described configuration. Specifically, the pixel 100 shown in FIG. 1 and the pixel 200 shown in FIG. 6 may be applied to an imaging element included in the imaging unit 10112. Furthermore, by applying the pixel 100 of the stacked structure shown in FIG. 12 to the imaging unit 10112, it is possible to mount the imaging element to which the present technology is applied without changing the size of the capsule endoscope 10100. By applying the present technology, it is possible to obtain a sharp image of a surgical site with less noise.

<Application to Endoscopic Surgery System>

Figure 14:
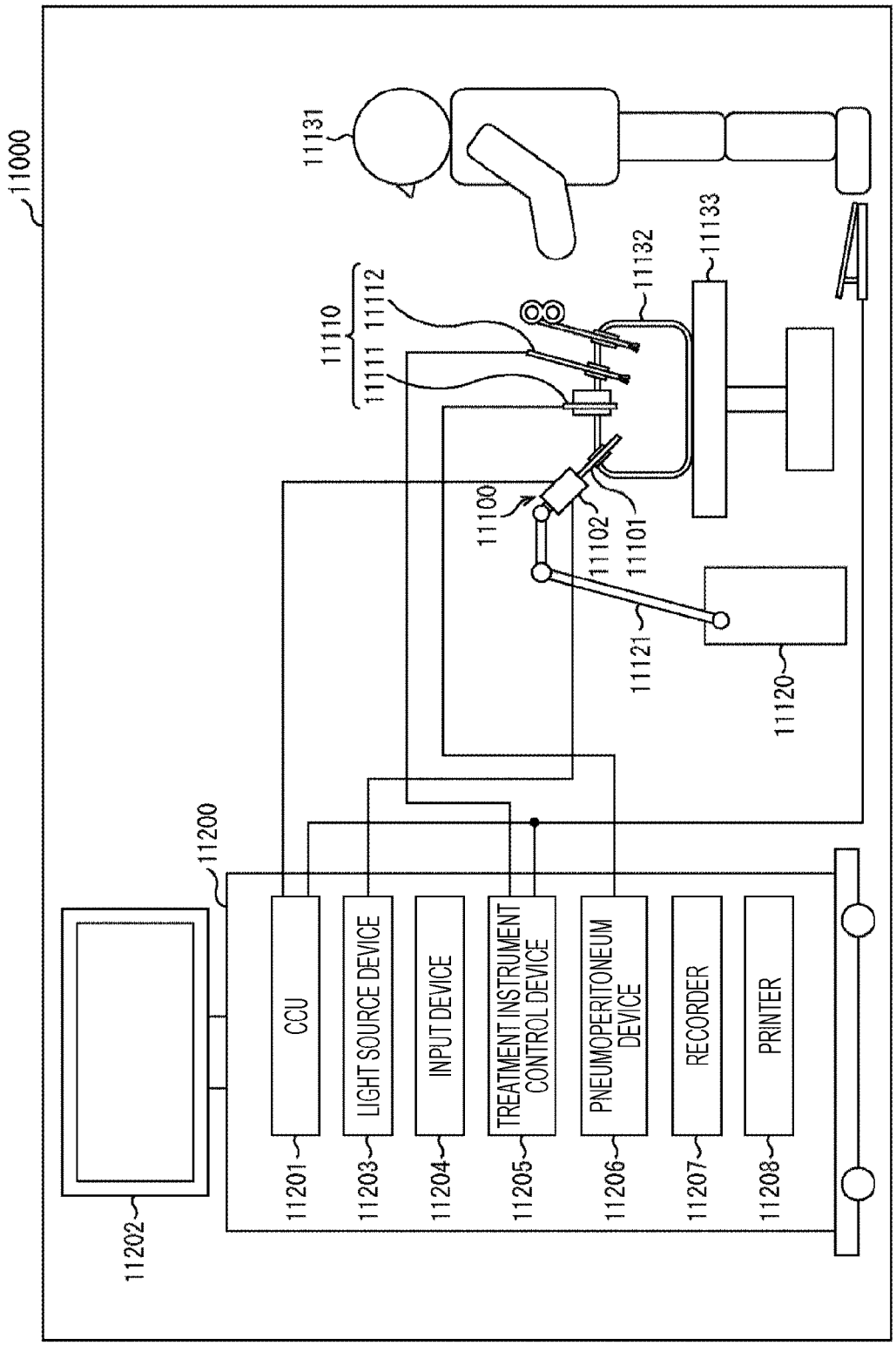
FIG. 14 is a diagram showing an example of a schematic configuration of an endoscopic surgery system.

FIG. 14 is a diagram showing an example of a schematic configuration of an endoscopic surgery system to which the technology (the present technology) according to the present disclosure can be applied.

FIG. 14 shows a situation where a surgeon (physician) 11131 performs surgery on a patient 11132 on a patient bed 11133 using an endoscopic surgery system 11000. As shown in the drawing, the endoscopic surgery system 11000 includes an endoscope 11100, other surgical tools 11110 such as a pneumoperitoneum tube 11111 and an energy treatment instrument 11112, a support arm device 11120 that supports the endoscope 11100, and a cart 11200 on which various devices for endoscopic surgery are mounted.

The endoscope 11100 includes a lens barrel 11101 in which a region of a predetermined length from the distal end is inserted into the body cavity of the patient 11132, and a camera head 11102 connected to the proximal end of the lens barrel 11101. In the illustrated example, the endoscope 11100 formed as a so-called rigid mirror having a rigid lens barrel 11101 is illustrated. However, the endoscope 11100 may be formed as a so-called flexible mirror having a flexible lens barrel.

At the tip of the lens barrel 11101, an opening portion into which an objective lens is fitted is provided. The light source device 11203 is connected to the endoscope 11100 and light generated by the light source device 11203 is guided to the distal end of the lens barrel by a light guide extending inside the lens barrel 11101, and is emitted toward the observation target in the body cavity of the patient 11132 via the objective lens. Note that the endoscope 11100 may be a direct view mirror, a perspective mirror or a side view mirror.

An optical system and an imaging element are provided inside the camera head 11102, and reflected light (observation light) from the observation target is collected to the imaging element by the optical system. The observation light is photoelectrically converted by the imaging element, and an electric signal corresponding to the observation light, that is, an image signal corresponding to the observation image is generated. The image signal is transmitted as RAW data to a camera control unit (CCU) 11201.

The CCU 11201 includes a central processing unit (CPU) or graphics processing unit (CPU), or the like, and centrally controls operation of the endoscope 11100 and the display device 11202. Moreover, the CCU 11201 receives an image signal from the camera head 11102, and performs various image processing for display of the image based on the image signal, such as, development processing (demosaic processing), for example, for the image signal.

The display device 11202 displays the image based on the image signal subjected to image processing by the CCU 11201 under the control of the CCU 11201.

The light source device 11203 includes a light source such as a light emitting diode (LED), for example, and supplies irradiation light to the endoscope 11100 in photographing a surgical site or the like.

The input device 11204 is an input interface to the endoscopic surgery system 11000. The user can input various information and input instructions to the endoscopic surgery system 11000 via the input device 11204. For example, the user inputs an instruction or the like to change imaging conditions by the endoscope 11100 (kind of irradiation light, magnification, focal length, or the like).

The treatment instrument control device 11205 controls driving of the energy treatment instrument 11112 for cauterizing tissue, cutting incisions, sealing blood vessels, or the like. The pneumoperitoneum device 11206 feeds gas into the body cavity of the patient 11132 via the pneumoperitoneum tube 11111 to inflate the body cavity for the purpose of securing a visual field by the endoscope 11100 and securing a working space of the surgeon. The recorder 11207 is a device capable of recording various kinds of information associated with surgery. The printer 11208 is a device capable of printing various kinds of information associated with surgery in various formats such as text, image, and graph.

Note that the light source device 11203 that supplies irradiation light in photographing of a surgical site to the endoscope 11100 can include, for example, a white light source including an LED, a laser light source, or a combination thereof. In a case where the white light source is configured by the combination of the RGB laser light sources, since the output intensity and the output timing of each color (each wavelength) can be controlled with high accuracy, adjustment of the white balance of the captured image by the light source device 11203 can be performed. Furthermore, in this case, the laser light from each of the RGB laser light sources is emitted to the observation target in time division and driving of the imaging element of the camera head 11102 is controlled in synchronization with the emission timing, so that it is possible to image images corresponding to each of RGB in time division. According to this method, a color image can be obtained without providing a color filter in the imaging element.

Furthermore, the light source device 11203 may be controlled to change the intensity of light to be output at predetermined time intervals. The driving of the imaging element of the camera head 11102 is controlled in synchronization with the timing of the change of the intensity of the light, images are obtained in time division, and the images are combined, so that it is possible to generate a high dynamic image in which so-called halation and black defects do not exist.

Furthermore, the light source device 11203 may be configured to be capable of supplying light of a predetermined wavelength band corresponding to special light observation. In the special light observation, for example, the wavelength dependence of light absorption in the body tissue is utilized, and narrow band light compared with irradiation light at the time of ordinary observation (in other words, white light) is emitted, so that photographing a predetermined tissue such as a blood vessel in the mucosal surface layer with high contrast, so-called narrow band imaging), is performed. Alternatively, in the special light observation, fluorescence observation for obtaining an image by fluorescence generated by emitting excitation light may be performed. In the fluorescence observation, it is possible to irradiate a body tissue with excitation light to observe the fluorescence from the body tissue (autofluorescence observation), or to inject a reagent such as indocyanine green (ICG) to the body tissue and irradiate the body tissue with excitation light corresponding to the fluorescence wavelength of the reagent to obtain a fluorescent image, for example. The light source device 11203 can be configured to be able to supply narrowband light and/or excitation light corresponding to such special light observation.

Figure 15:
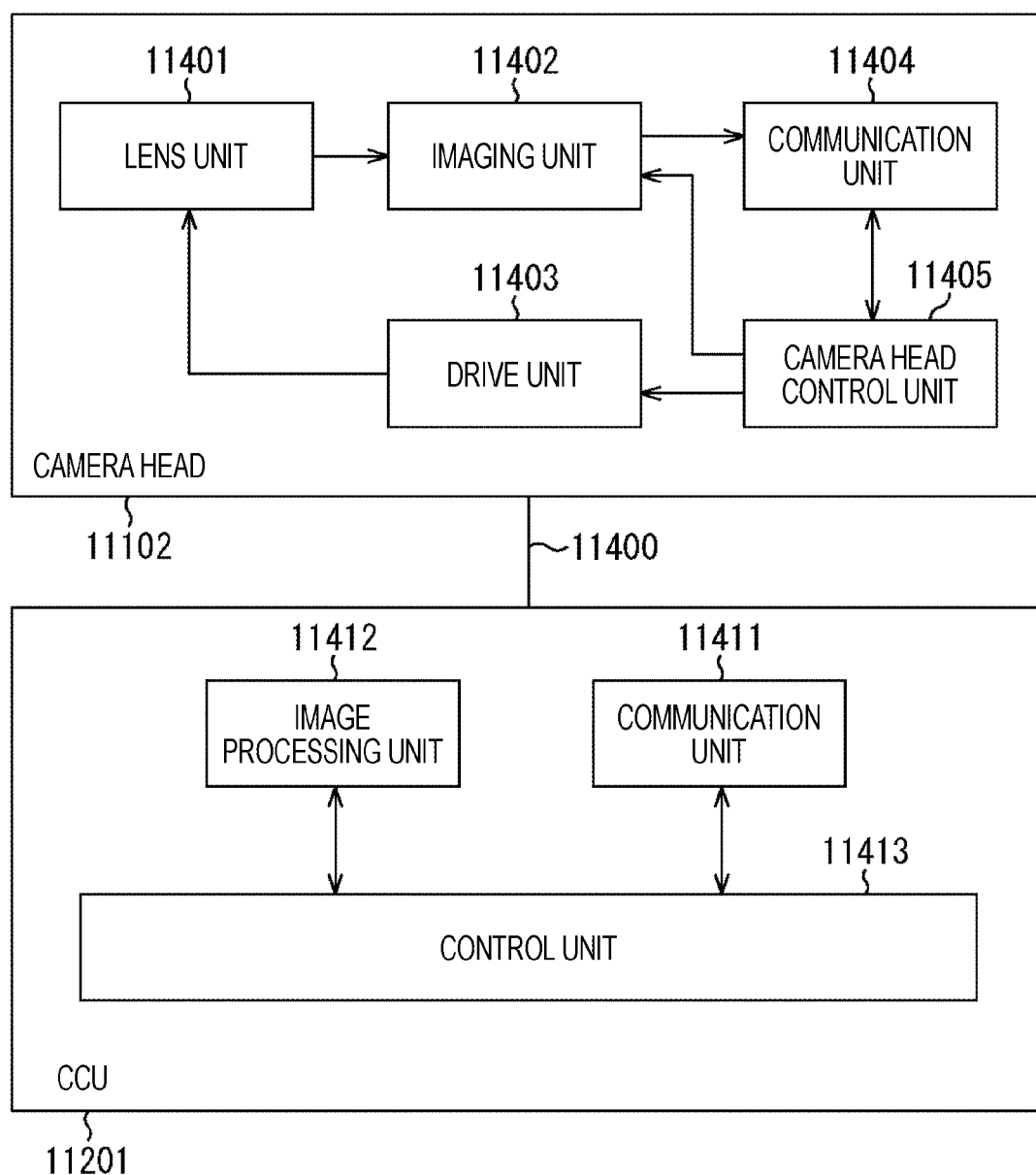
FIG. 15 is a block diagram showing an example of a functional configuration of a camera head and a CCU.

FIG. 15 is a block diagram showing an example of a functional configuration of the camera head 11102 and the CCU 11201 shown in FIG. 14.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a connecting portion with the lens barrel 11101. The observation light taken in from the distal end of the lens barrel 11101 is guided to the camera head 11102 and is incident on the lens unit 11401. The lens unit 11401 is configured by combining a plurality of lenses including a zoom lens and a focus lens.

The imaging element included in the imaging unit 11402 may be one (so-called single plate type) or plural (so-called multiple plate type). In the case where the imaging unit 11402 is formed in a multiple plate type, for example, image signals corresponding to each of R, G, and B may be generated by each imaging element, and the signals may be combined so that a color image is obtained. Alternatively, the imaging unit 11402 may have a pair of imaging elements for acquiring right-eye and left-eye image signals corresponding to 3 dimensional (3D) display, respectively. By the 3D display, the surgeon 11131 can grasp the depth of a living tissue in the surgical site more accurately. Note that, in a case where the imaging unit 11402 is formed in a multiple plate type, a plurality of lens units 11401 can be provided corresponding to each imaging element.

Furthermore, the imaging unit 11402 is not necessarily provided in the camera head 11102. For example, the imaging unit 11402 may be provided inside the lens barrel 11101 immediately after the objective lens.

The drive unit 11403 includes an actuator and moves the zoom lens and the focus lens of the lens unit 11401 by a predetermined distance along the optical axis under the control of the camera head control unit 11405. As a result, the magnification and the focus of the captured image by the imaging unit 11402 can be appropriately adjusted.

The communication unit 11404 includes a communication device for transmitting and receiving various kinds of information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal may include, for example, information associated with imaging conditions such as information that a frame rate of the imaging image is designated, information that an exposure value at the time of imaging is designated, and/or information that the magnification and focus of the captured image is designated.

Note that the imaging conditions such as the frame rate, the exposure value, the magnification, and the focus may be appropriately specified by a user, or may be automatically set by the control unit 11413 of the CCU 11201 on the basis of the acquired image signal. In the latter case, the so-called auto exposure (AE) function, the auto focus (AF) function, and the auto white balance (AWB) function are installed in the endoscope 11100.

The camera head control unit 11405 controls driving of the camera head 11102 on the basis of the control signal from the CCU 11201 received via the communication unit 11404.

The communication unit 11411 includes a communication device for transmitting and receiving various kinds of information to and from the camera head 11102. The communication unit 11411 receives an image signal transmitted from the camera head 11102 via the transmission cable 11400.

Furthermore, the communication unit 11411 transmits a control signal for controlling driving of the camera head 11102 to the camera head 11102. The image signal and the control signal can be transmitted by electric communication, optical communication, or the like.

The image processing unit 11412 performs various image processing on the image signal which is RAW data transmitted from the camera head 11102.

The control unit 11413 performs various control relating to imaging of a surgical site or the like by the endoscope 11100, and display of captured images obtained by imaging of a surgical site or the like. For example, the control unit 11413 generates a control signal for controlling driving of the camera head 11102.

Furthermore, the control unit 11413 causes the display device 11202 to display the captured image including a surgical site or the like on the basis of the image signal subjected to the image processing by the image processing unit 11412. In this case, the control unit 11413 may recognize various objects in the captured image using various image recognition techniques. For example, the control unit 11413 can recognize a surgical tool such as a forceps, a specific body part, bleeding, a mist at the time of using the energy treatment instrument 11112, or the like by detecting the shape, color, or the like of the edge of the object included in the captured image. When causing the display device 11202 to display the captured image, the control unit 11413 may cause various surgical operation support information to be superimposed and displayed on the image of the surgical site using the recognition result. The surgical operation support information is superimposed and displayed, and presented to the surgeon 11131, so that the burden on the surgeon 11131 can be reduced and the surgeon 11131 can reliably proceed with surgery.

The transmission cable 11400 connecting the camera head 11102 and the CCU 11201 is an electric signal cable corresponding to communication of electric signals, an optical fiber corresponding to optical communication, or a composite cable thereof.

Here, in the example shown in the drawing, communication is performed by wire using the transmission cable 11400. However, communication between the camera head 11102 and the CCU 11201 may be performed wirelessly.

An example of the endoscopic surgery system to which the technology according to the present disclosure can be applied has been described above. The technology according to the present disclosure can be applied to the imaging unit 11402 in the above-described configuration. Specifically, the pixel 100 shown in FIG. 1 and the pixel 200 shown in FIG. 6 can be applied to an imaging element included in the imaging unit 11402. By applying the present technology, it is possible to obtain a sharp image of a surgical site with less noise.

Note that, although an endoscopic surgery system has been described as an example here, the technology according to the present disclosure may also be applied to, for example, a microscopic surgery system or the like.

Application Example to Mobile Body

The technology (the present technology) according to the present disclosure can be applied to various products. For example, the technology according to the present disclosure may be realized as a device mounted on any type of mobile body such as a car, electric vehicle, hybrid electric vehicle, motorcycle, bicycle, personal mobility, airplane, drone, ship, or robot.

Figure 16:
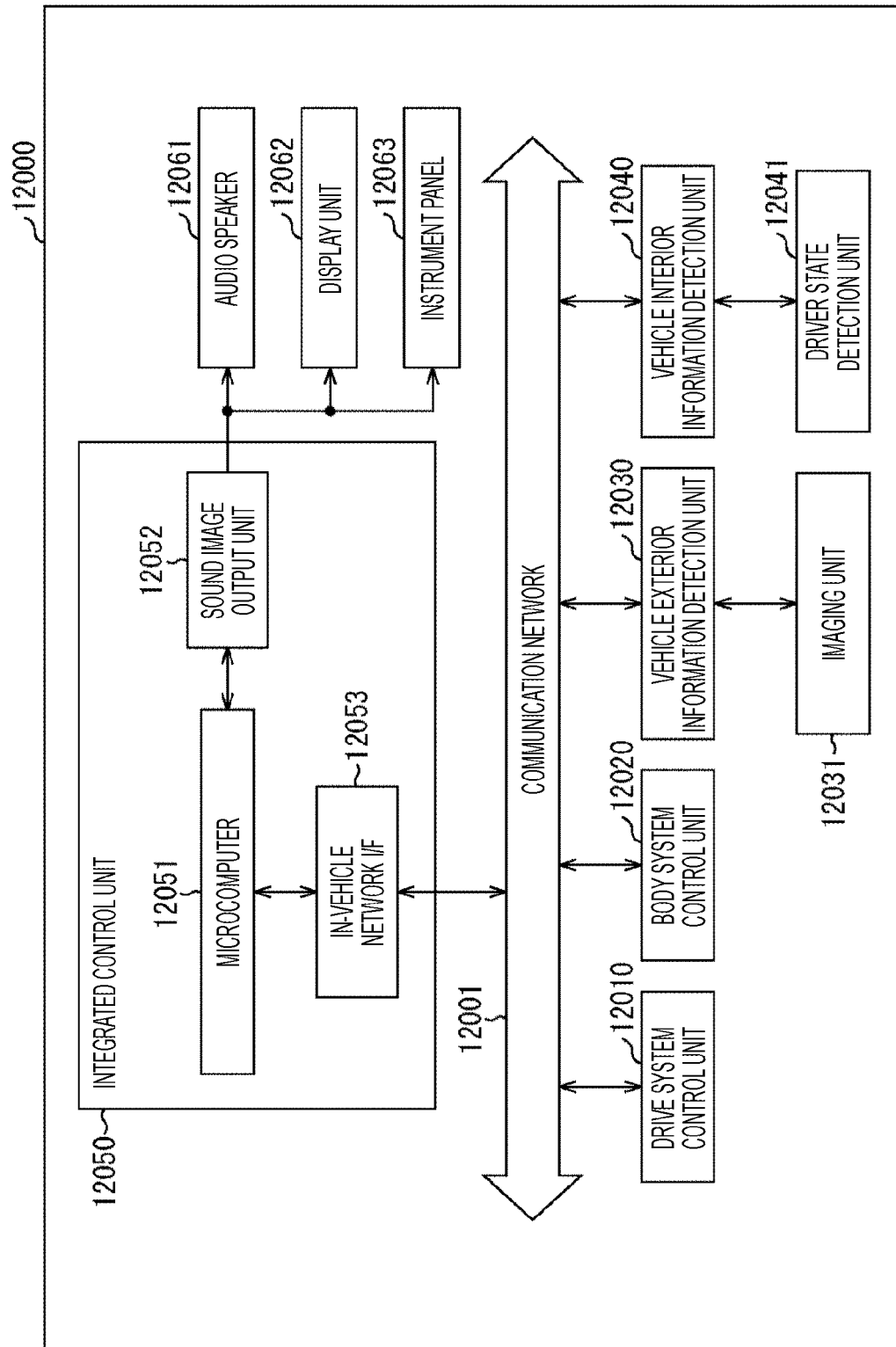
FIG. 16 is a block diagram showing a schematic configuration example of a vehicle control system.

FIG. 16 is a block diagram showing a schematic configuration example of a vehicle control system which is an example of a mobile body control system to which the technology according to the present disclosure can be applied.

The vehicle control system 12000 includes a plurality of electronic control units connected via a communication network 12001. In the example shown in FIG. 16, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound image output unit 12052, and an in-vehicle network interface (I/F) 12053 are illustrated.

The drive system control unit 12010 controls the operation of devices related to the drive system of the vehicle according to various programs. For example, the drive system control unit 12010 functions as a control device for a driving force generating device for generating a driving force of a vehicle such as an internal combustion engine or a driving motor, a driving force transmitting mechanism for transmitting a driving force to the wheels, a steering mechanism that adjusts steering of a vehicle, a braking device that generates a braking force of a vehicle, or the like.

The body system control unit 12020 controls the operation of various devices equipped in a vehicle body according to various programs. For example, the body system control unit 12020 functions as a control device for a keyless entry system, a smart key system, a power window device, or various lamps such as a head lamp, a back lamp, a brake lamp, a turn indicator, or a fog lamp. In this case, a radio wave transmitted from a portable device that substitutes for a key or a signal of various switches may be input to the body system control unit 12020. The body system control unit 12020 receives the input of these radio waves or signals and controls a door lock device, a power window device, a lamp, or the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform object detection processing or distance detection processing such as a person, a car, an obstacle, a sign, or a character on a road surface, on the basis of the received image.

The imaging unit 12031 is an optical sensor that receives light and outputs an electric signal corresponding to the amount of light received. The imaging unit 12031 can output an electric signal as an image or output the electric signal as distance measurement information. Furthermore, the light received by the imaging unit 12031 may be visible light or invisible light such as infrared light.

The vehicle interior information detection unit 12040 detects information inside the vehicle. For example, a driver state detection unit 12041 that detects the state of the driver is connected to the vehicle interior information detection unit 12040. The driver state detection unit 12041 includes, for example, a camera that images the driver, and the vehicle interior information detection unit 12040 may calculate the degree of fatigue or degree of concentration of the driver on the basis of the detection information input from the driver state detection unit 12041, or may determine whether or not the driver is dozing off.

The microcomputer 12051 can calculate a control target value of the driving force generating device, the steering mechanism or the braking device on the basis of the information inside and outside of the vehicle acquired by the vehicle exterior information detection unit 12030 or the vehicle interior information detection unit 12040, and can output a control command to the drive system control unit 12010. For example, the microcomputer 12051 can perform cooperative control for the purpose of realization of the function of advanced driver assistance system (ADAS) including collision avoidance or impact mitigation of the vehicle, follow-up running based on the distance between vehicles, vehicle speed maintenance running, vehicle collision warning, vehicle lane departure warning, or the like.

Furthermore, the microcomputer 12051 controls the driving force generating device, the steering mechanism, the braking device, or the like on the basis of the information regarding the surroundings of the vehicle acquired by the vehicle exterior information detection unit 12030 or the vehicle interior information detection unit 12040, so that the microcomputer 12051 can perform cooperative control for the purpose of automatic driving in which a vehicle autonomously runs without depending on the operation of the driver, or the like.

Furthermore, the microcomputer 12051 can output a control command to the body system control unit 12020 on the basis of the vehicle exterior information acquired by the vehicle exterior information detection unit 12030. For example, the microcomputer 12051 can control the headlamp according to the position of the preceding vehicle or the oncoming vehicle detected by the vehicle exterior information detection unit 12030, and perform cooperative control for the purpose of antiglare such as switching the high beam to low beam.

The sound image output unit 12052 transmits at least one of sound or image output signals to an output device capable of visually or audibly notifying the occupant of the vehicle or the outside of the vehicle, of information. In the example of FIG. 16, as an output device, an audio speaker 12061, a display unit 12062, and an instrument panel 12063 are illustrated. The display unit 12062 may include at least one of an on-board display or a head-up display, for example.

Figure 17:
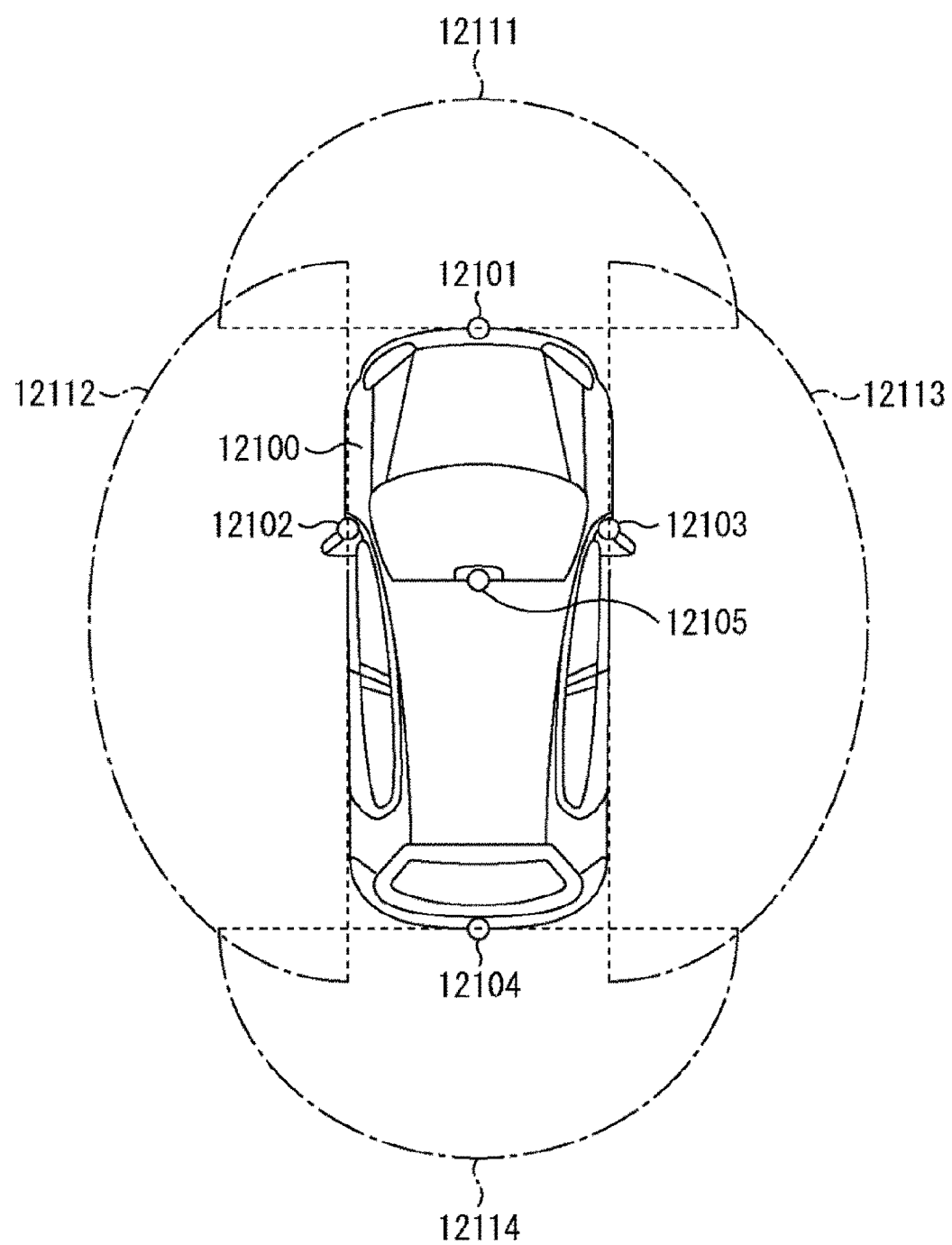
FIG. 17 is an explanatory diagram showing an example of an installation position of an imaging unit.

FIG. 17 is a diagram showing an example of an installation position of the imaging unit 12031.

In FIG. 17, as the imaging unit 12031, imaging units 12101, 12102, 12103, 12104, 12105 are included.

For example, the imaging units 12101, 12102, 12103, 12104, 12105 are provided at positions such as the front nose, the side mirror, the rear bumper, the back door, and the upper portion of the windshield in the vehicle compartment of the vehicle 12100. The imaging unit 12101 included in the front nose and the imaging unit 12105 included in the upper portion of the windshield in the vehicle compartment mainly acquire an image of the forward of the vehicle 12100. The imaging units 12102 and 12103 included in the side mirrors mainly acquire images of the sides of the vehicle 12100. The imaging unit 12104 included in the rear bumper or the back door mainly acquires images of the rearward of the vehicle 12100. The imaging unit 12105 included in the upper portion of the windshield in the vehicle compartment is mainly used for detection of a preceding vehicle, a pedestrian, an obstacle, a traffic signal, a traffic sign, a lane, or the like.

Note that FIG. 17 shows an example of the imaging range of the imaging units 12101 to 12104. An imaging range 12111 indicates an imaging range of the imaging unit 12101 provided in the front nose, the imaging ranges 12112, 12113 indicate the imaging range of the imaging units 12102, 12103 provided in the side mirror, respectively, and the imaging range 12114 indicates the imaging range of the imaging unit 12104 provided in the rear bumper or the back door. For example, by overlapping the image data imaged by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having a pixel for phase difference detection.

For example, the microcomputer 12051 obtains the distance to each three-dimensional object within the imaging range 12111 to 12114 and the temporal change of the distance (relative speed with respect to the vehicle 12100), on the basis of the distance information obtained from the imaging units 12101 to 12104, so that the microcomputer 12051 can extract a three-dimensional object that is the closest on the traveling path of the vehicle 12100 and runs at a predetermined speed (for example, 0 km/h or more) in substantially the same direction as that of the vehicle 12100, as a preceding vehicle. Moreover, the microcomputer 12051 can set an inter-vehicle distance to be secured in front of the preceding vehicle, and can perform automatic brake control (including follow-up stop control), automatic acceleration control (including follow-up start control), or the like. In this manner, it is possible to perform cooperative control for the purpose of automatic driving or the like that autonomously runs without depending on the operation of the driver.

For example, on the basis of the distance information obtained from the imaging units 12101 to 12104, the microcomputer 12051 can classify three-dimensional object data on the three-dimensional object into three-dimensional objects such as a two-wheeled vehicle, a regular vehicle, a large vehicle, a pedestrian, a telephone pole, and other three-dimensional objects, and extract the result to use the result for automatic avoidance of obstacles. For example, the microcomputer 12051 identifies an obstacle in the vicinity of the vehicle 12100 as an obstacle that the driver of the vehicle 12100 can see and an obstacle that is difficult to see. Then, the microcomputer 12051 determines the collision risk indicating the risk of collision with each obstacle, and when the collision risk is higher than a set value and there is a possibility of collision, the microcomputer 12051 can output an alarm to the driver via the audio speaker 12061 and the display unit 12062 or perform forced deceleration or avoiding steering via the drive system control unit 12010, so as to perform driving assistance for collision avoidance.

At least one of the imaging units 12101 to 12104 may be an infrared camera for detecting infrared rays. For example, the microcomputer 12051 can recognize a pedestrian by determining whether or not a pedestrian exists in the captured images of the imaging units 12101 to 12104. Such recognizing of a pedestrian is performed, for example, by a procedure of extracting feature points in the captured image of the imaging units 12101 to 12104 as an infrared camera and a procedure of performing pattern matching processing on a series of feature points indicating the outline of the object and discriminate whether or not it is a pedestrian. If the microcomputer 12051 determines that a pedestrian exists in the captured images of the imaging units 12101 to 12104 and recognizes the pedestrian, the sound image output unit 12052 controls the display unit 12062 to superimpose and display a rectangular contour line for emphasis on the recognized pedestrian. Furthermore, the sound image output unit 12052 may control the display unit 12062 to display icons or the like indicating pedestrians at desired positions.

An example of the vehicle control system to which the technology according to the present disclosure can be applied has been described above. The technology according to the present disclosure can be applied to the imaging unit 12031 in the above-described configuration. Specifically, the pixel 100 shown in FIG. 1 and the pixel 200 shown in FIG. 6 may be applied to an imaging element included in the imaging unit 12031. By applying the present technology, it is possible to obtain a sharp image of a surgical site with less noise.

In this specification, the term "system" refers to the entire device including a plurality of devices.

Note that the effects described in the present specification are merely examples and are not intended to be limiting, and other effects may be provided.

Note that the embodiments of the present technology are not limited to the above-described embodiments, and various modifications are possible without departing from the gist of the present technology.

Note that, the present technology can adopt the following configuration.

(1)

An imaging element including:

a photoelectric conversion element;

a first amplification element that amplifies a signal from the photoelectric conversion element;

a second amplification element that amplifies an output from the first amplification element;

an offset element provided between the first amplification element and the second amplification element;

a first reset element that resets the first amplification element; and a second reset element that resets the second amplification element.

(2)

The imaging element described in (1) above, in which the offset element is a capacitor.

(3)

The imaging element described in (1) or (2) above, in which a charge is accumulated in the offset element via a feedback loop of an output from the second amplification element, and an offset bias is generated.

(4)

The imaging element described in any of (1) to (3) above, in which a reverse phase of a difference between an output signal from the second amplification element and a reference signal is supplied to the second reset element.

(5)

The imaging element described in any of (1) to (3) above, in which an output signal from the second amplification element and a reference signal is input to a differential amplifier, and an output from the differential amplifier is supplied to the second reset element.

(6)

The imaging element described in (5) above, in which the differential amplifier includes the second reset element and a current mirror circuit.

(7)

The imaging element described in any of (1) to (6) above, in which an input parasitic capacitance of the second amplification element is larger than an input parasitic capacitance of the first amplification element.

(8)

The imaging element described in any of (1) to (7) above, in which after the first amplification element is reset by the first reset element, the second amplification element is reset by the second reset element.

(9)

The imaging element described in any of (1) to (7) above, in which charge transfer and resetting of the photoelectric conversion element are performed in the same period.

(10)

The imaging element described in any of (1) to (7) above further including a detection unit that detects a signal from the second amplification element, in which the detection unit performs sampling of each of a reset signal and an accumulated signal, including processing of correlated double sampling.

(11)

The imaging element described in (10) above, in which the detection unit considers a predetermined row as a processing target and performs sampling of a reset signal from the predetermined row, and performs sampling of accumulated signals from all the rows including the predetermined row.

(12)

The imaging element described in any of (1) to (7) above further including a detection unit that detects a signal from the second amplification element, in which the detection unit does not perform sampling of a reset signal and only performs sampling of an accumulated signal, including processing of correlated double sampling.

(13)

The imaging element described in any of (1) to (12) above, in which the photoelectric conversion element, the first amplification element, and the first reset element are formed in a first layer, the offset element, the second amplification element, and the second reset element are formed in a second layer, and the first layer and the second layer are stacked.

(14)

The imaging element described in (13) above, in which the detection unit that detects the signal from the second amplification element is formed in a third layer, and the first layer, the second layer, and the third layer are stacked.

REFERENCE SIGNS LIST

21 Photodiode
22 Cathode (accumulation node)
23 Power supply
24 Output node
25 Transfer transistor
26 First amplification transistor
27 First reset transistor
28 First detection node
29 Load transistor
31 Coupling capacitor
32 Second detection node (input node)
33 Second amplification transistor
34 Select transistor
35 Second reset transistor
36 Output signal line
50 Row drive circuit
51 Load transistor
52 Detection circuit
53 Differential amplification
54 Feedback signal line
100 Pixel
200 Pixel
221 Second amplification transistor
222 Second reset transistor
223 Capacitor
251 Current mirror circuit
252 Reference voltage input amplification transistor
253 Current/operating point adjusting transistor
254 Source line
201 Row drive circuit
311 First silicon layer
312 Second silicon layer

The invention claimed is:

1. An imaging element, comprising:
   a photoelectric conversion element;
   a first amplification element that amplifies a signal from the photoelectric conversion element;
   a second amplification element that amplifies an output from the first amplification element;
   an offset element provided between the first amplification element and the second amplification element;
   a first reset element that resets the first amplification element;
   a second reset element that resets the second amplification element;
   a differential amplifier, wherein an output signal from the second amplification element and a reference signal are input to the differential amplifier, and wherein an output from the differential amplifier is supplied to the second reset element.

2. The imaging element according to claim 1, wherein the offset element is a capacitor.

3. The imaging element according to claim 1, wherein a charge is accumulated in the offset element via a feedback loop of an output from the second amplification element, and an offset bias is generated.

4. The imaging element according to claim 1, wherein the differential amplifier includes the second reset element and a current mirror circuit.

5. The imaging element according to claim 1, wherein an input parasitic capacitance of the second amplification element is larger than an input parasitic capacitance of the first amplification element.

6. The imaging element according to claim 1, wherein after the first amplification element is reset by the first reset element, the second amplification element is reset by the second reset element.

7. The imaging element according to claim 1, wherein charge transfer and resetting of the photoelectric conversion element are performed in the same period.

8. The imaging element according to claim 1, further comprising a detection unit that detects a signal from the second amplification element,
   wherein the detection unit performs sampling of each of a reset signal and an accumulated signal, including processing of correlated double sampling.

9. The imaging element according to claim 8, wherein the detection unit considers a predetermined row as a processing target and performs sampling of a reset signal from the predetermined row, and
   performs sampling of accumulated signals from all the rows including the predetermined row.

10. The imaging element according to claim 1, further comprising a detection unit that detects a signal from the second amplification element,
    wherein the detection unit does not perform sampling of a reset signal and only performs sampling of an accumulated signal, including processing of correlated double sampling.

11. The imaging element according to claim 1, wherein the photoelectric conversion element, the first amplification element, and the first reset element are formed in a first layer,
    the offset element, the second amplification element, and the second reset element are formed in a second layer, and
    the first layer and the second layer are stacked.

12. The imaging element according to claim 11, wherein the detection unit that detects the signal from the second amplification element is formed in a third layer, and
    the first layer, the second layer, and the third layer are stacked.

* * * * *